(12) United States Patent
Lei et al.

(10) Patent No.: US 12,358,073 B2
(45) Date of Patent: Jul. 15, 2025

(54) METHOD AND APPARATUS FOR LASER DRILLING BLIND VIAS

(71) Applicant: Applied Materials, Inc., Santa Clara, CA (US)

(72) Inventors: Wei-Sheng Lei, San Jose, CA (US); Kurtis Leschkies, San Jose, CA (US); Roman Gouk, San Jose, CA (US); Steven Verhaverbeke, San Francisco, CA (US); Visweswaren Sivaramakrishnan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 226 days.

(21) Appl. No.: 17/508,512

(22) Filed: Oct. 22, 2021

(65) Prior Publication Data
US 2022/0044936 A1 Feb. 10, 2022

Related U.S. Application Data

(63) Continuation of application No. 16/928,252, filed on Jul. 14, 2020, now Pat. No. 11,232,951.

(51) Int. Cl.
*H01L 21/268* (2006.01)
*B23K 26/00* (2014.01)
(Continued)

(52) U.S. Cl.
CPC ........ *B23K 26/0006* (2013.01); *B23K 26/386* (2013.01); *H01L 21/681* (2013.01);
(Continued)

(58) Field of Classification Search
CPC .. B23K 26/386; B23K 26/03; B23K 26/0006; H01L 21/681; H01L 21/76804; H01L 21/268
See application file for complete search history.

(56) References Cited

U.S. PATENT DOCUMENTS

| 4,073,610 A | 2/1978 | Cox |
| 4,644,130 A | 2/1987 | Bachmann |

(Continued)

FOREIGN PATENT DOCUMENTS

| CA | 2481616 C | 1/2013 |
| CN | 1971894 A | 5/2007 |

(Continued)

OTHER PUBLICATIONS

Yu et al. "High Performance, High Density RDL for Advanced Packaging," 2018 IEEE 68th Electronic Components and Technology Conference, pp. 587-593, DOI 10.1109/ETCC.2018.0009.
(Continued)

*Primary Examiner* — Joseph A Miller, Jr.
(74) *Attorney, Agent, or Firm* — Patterson + Sheridan, LLP

(57) ABSTRACT

In an embodiment, a method of forming a blind via in a substrate comprising a mask layer, a conductive layer, and a dielectric layer is provided. The method includes detecting the mask layer by a sensor, the mask layer providing a substrate surface; determining a property of the blind via, the property comprising one or more of a top diameter, a bottom diameter, a volume, or a taper angle; focusing a Gaussian laser beam, under laser process parameters, at the substrate surface to remove at least a portion of the mask layer; adjusting the laser process parameters based on the property; and focusing the laser beam, under the adjusted laser process parameters, to remove at least a portion of the dielectric layer within the volume to form the blind via. The mask layer can be pre-etched. Apparatus for forming a blind via in a substrate are also provided.

17 Claims, 8 Drawing Sheets

(51) Int. Cl.
  *B23K 26/386* (2014.01)
  *H01L 21/68* (2006.01)
  *H01L 21/768* (2006.01)
  *H01L 21/67* (2006.01)

(52) U.S. Cl.
  CPC ...... *H01L 21/76804* (2013.01); *H01L 21/268* (2013.01); *H01L 21/67115* (2013.01)

(56) References Cited

U.S. PATENT DOCUMENTS

| | | |
|---|---|---|
| 5,126,016 A | 6/1992 | Glenning et al. |
| 5,268,194 A | 12/1993 | Kawakami et al. |
| 5,353,195 A | 10/1994 | Fillion et al. |
| 5,367,143 A | 11/1994 | White, Jr. |
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,099 A | 11/1998 | Owen et al. |
| 5,841,102 A | 11/1998 | Noddin |
| 5,878,485 A | 3/1999 | Wood et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,531,767 B2 | 5/2009 | Arai et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,893,045 B2 | 2/2018 | Pagaila et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |

(56) References Cited

U.S. PATENT DOCUMENTS

| | | |
|---|---|---|
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0211356 A1* | 10/2004 | Yamazaki ............... C23C 14/48 117/84 |
| 2004/0248412 A1 | 12/2004 | Liu et al. |
| 2004/0266159 A1 | 12/2004 | Gardecki et al. |
| 2005/0012217 A1 | 1/2005 | Mori et al. |
| 2005/0170292 A1 | 8/2005 | Tsai et al. |
| 2005/0212091 A1* | 9/2005 | Usui ............... H01L 21/76814 257/621 |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Jafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2008/0006945 A1 | 1/2008 | Lin et al. |
| 2008/0011852 A1 | 1/2008 | Gu et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0084596 A1 | 4/2009 | Inoue et al. |
| 2009/0243065 A1 | 10/2009 | Sugino et al. |
| 2009/0250823 A1 | 10/2009 | Racz et al. |
| 2009/0255911 A1* | 10/2009 | Krishnaswami ....... B23K 26/083 219/121.76 |
| 2009/0278126 A1 | 11/2009 | Yang et al. |
| 2010/0013081 A1 | 1/2010 | Toh et al. |
| 2010/0062287 A1 | 3/2010 | Beresford et al. |
| 2010/0065759 A1* | 3/2010 | Liu ...................... B23K 26/127 250/492.1 |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0204505 A1 | 8/2011 | Pagaila et al. |
| 2011/0259631 A1 | 10/2011 | Rumsby |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0146209 A1 | 6/2012 | Hu et al. |
| 2012/0164827 A1 | 6/2012 | Rajagopalan et al. |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0203190 A1 | 8/2013 | Reed et al. |
| 2013/0267076 A1* | 10/2013 | Lei ........................ B23K 26/40 438/460 |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0057414 A1* | 2/2014 | Iyer .................. B23K 26/0661 219/121.67 |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0228416 A1 | 8/2015 | Hurwitz et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118337 A1 | 4/2016 | Yoon et al. |
| 2016/0194750 A1* | 7/2016 | Hashimoto ......... C23C 28/3455 204/192.15 |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0116057 A1 | 4/2018 | Kajihara et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0355680 A1 | 11/2019 | Chuang et al. |
| 2019/0369321 A1 | 12/2019 | Young et al. |

(56) References Cited

U.S. PATENT DOCUMENTS

| | | |
|---|---|---|
| 2020/0003936 A1 | 1/2020 | Fu et al. |
| 2020/0008305 A1 | 1/2020 | Clark |
| 2020/0039002 A1 | 2/2020 | Sercel et al. |
| 2020/0130131 A1 | 4/2020 | Togawa et al. |
| 2020/0357947 A1 | 11/2020 | Chen et al. |
| 2020/0358163 A1 | 11/2020 | See et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 101652028 A | 2/2010 |
| CN | 104637912 A | 5/2015 |
| CN | 105436718 A | 3/2016 |
| CN | 106531647 A | 3/2017 |
| CN | 106653703 A | 5/2017 |
| CN | 108028225 A | 5/2018 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |
| JP | H11233950 A | 8/1999 |
| JP | 2001244591 A | 9/2001 |
| JP | 2002246755 A | 8/2002 |
| JP | 2003188340 A | 7/2003 |
| JP | 2004311788 A | 11/2004 |
| JP | 2004335641 A | 11/2004 |
| JP | 4108285 B2 | 6/2008 |
| JP | 2010129723 A | 6/2010 |
| JP | 2010528866 A | 8/2010 |
| JP | 2012069926 A | 4/2012 |
| JP | 5004378 B2 | 8/2012 |
| JP | 5111342 B2 | 1/2013 |
| JP | 5693977 B2 | 4/2015 |
| JP | 5700241 B2 | 4/2015 |
| JP | 2016102964 A | 6/2016 |
| JP | 5981232 B2 | 8/2016 |
| JP | 6394136 B2 | 9/2018 |
| JP | 6542616 B2 | 7/2019 |
| JP | 6626697 B2 | 12/2019 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 101301507 B1 | 9/2013 |
| KR | 20140086375 A | 7/2014 |
| KR | 20140135278 A | 11/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 101975302 B1 | 8/2019 |
| KR | 102012443 B1 | 8/2019 |
| TW | 200900189 A | 1/2009 |
| TW | 201626869 A | 7/2016 |
| TW | I594397 B | 8/2017 |
| WO | 2004082879 A | 9/2004 |
| WO | 2011130300 A1 | 10/2011 |
| WO | 2013008415 A1 | 1/2013 |
| WO | 2013126927 A2 | 8/2013 |
| WO | 2015126438 | 8/2015 |
| WO | 2015126438 A1 | 8/2015 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |

OTHER PUBLICATIONS

Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.

Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.

S. W. Ricky Lee et al. "3D Stacked Flip Chip Packaging with Through Silicon Vias and Copper Plating or Conductive Adhesive Filling", 2005 IEEE, pp. 798-801.

K. Sakuma et al. "3D Stacking Technology with Low-Volume Lead-Free Interconnections", IBM T.J. Watson Research Center. 2007 IEEE, pp. 627-632.

Chien-Wei Chien et al "Chip Embedded Wafer Level Packaging Technology for Stacked RF-SiP Application",2007 IEEE, pp. 305-310.

Chien-Wei Chien et al. "3D Chip Stack With Wafer Through Hole Technology". 6 pages.

Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.

Junghoon Yeom', et al. "Critical Aspect Ratio Dependence in Deep Reactive Ion Etching of Silicon", 2003 IEEE. pp. 1631-1634.

Ronald Hon et al. "Multi-Stack Flip Chip 3D Packaging with Copper Plated Through-Silicon Vertical Interconnection", 2005 IEEE. pp. 384-389.

NT Nguyen et al. "Through-Wafer Copper Electroplating for Three-Dimensional Interconnects", Journal of Micromechanics and Microengineering. 12 (2002) 395-399. 2002 IOP.

Arifur Rahman. "System-Level Performance Evaluation of Three-Dimensional Integrated Circuits", vol. 8, No. 6, Dec. 2000. pp. 671-678.

L. Wang, et al. "High aspect ratio through-wafer interconnections for 3Dmicrosystems", 2003 IEEE. pp. 634-637.

International Search Report and the Written Opinion for International Application No. PCT/US2019/064280 mailed Mar. 20, 2020, 12 pages.

Italian search report and written opinion for Application No. IT 201900006736 dated Mar. 2, 2020.

Italian Search Report and Written Opinion for Application No. IT 201900006740 dated Mar. 4, 2020.

Allresist Gmbh—Strausberg et al: "Resist-Wiki: Adhesion promoter HMDS and diphenylsilanedio (AR 300-80) - . . . - Allresist GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/https://www.allresist.com/process-chemicals-adhesion-promoter-hmds-and-diphenylsilanedio/, [retrieved on Jan. 29, 2020].

Wu et al., Microelect. Eng., vol. 87 2010, pp. 505-509.

Trusheim, D. et al., Investigation of the Influence of Pulse Duration in Laser Processes for Solar Cells, Physics Procedia Dec. 2011, 278-285, 9 pages.

Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.

Baier, T. et al., Theoretical Approach to Estimate Laser Process Parameters for Drilling in Crystalline Silicon, Prog. Photovolt: Res. Appl. 18 (2010) 603-606, 5 pages.

Liu, C.Y. et al., Time Resolved Shadowgraph Images of Silicon during Laser Ablation: Shockwaves and Particle Generation, Journal of Physics: Conference Series 59 (2007) 338-342, 6 pages.

Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).

(56) References Cited

OTHER PUBLICATIONS

Han, Younggun, et al.—"Evaluation of Residual Stress and Warpage of Device Embedded Substrates with Piezo-Resistive Sensor Silicon Chips" technical paper, Jul. 31, 2015, pp. 81-94.
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].
International Search Report and Written Opinion for Application No. PCT/US2020/026832 dated Jul. 23, 2020.
Doany, F.E., et al.—"Laser release process to obtain freestanding multilayer metal-polyimide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Srinivasan, R., et al.—"Ultraviolet Laser Ablation of Organic Polymers," Chemical Reviews, 1989, vol. 89, No. 6, pp. 1303-1316.
Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.
Shi, Tailong, et al.—"First Demonstration of Panel Glass Fan-out (GFO) Packages for High I/O Density and High Frequency Multichip Integration," Proceedings of 2017 IEEE 67th Electronic Components and Technology Conference, May 30-Jun. 2, 2017, pp. 41-46.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
PCT International Search Report and Written Opinion dated Sep. 15, 2020, for International Application No. PCT/US2020/035778.
PCT International Search Report and Written Opinion dated Aug. 28, 2020, for International Application No. PCT/US2020/032245.
Taiwan Office Action dated Oct. 27, 2020 for Application No. 108148588.
PCT International Search Report and Written Opinion dated Feb. 17, 2021 for International Application No. PCT/US2020/057787.
PCT International Search Report and Written Opinion dated Feb. 19, 2021 for International Application No. PCT/US2020/057788.
U.S. Office Action dated May 13, 2021, in U.S. Appl. No. 16/870,843.
Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.
Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.
Malta, D., et al.—"Fabrication of TSV-Based Silicon Interposers," 3D Systems Integration Conference (3DIC), 2010 IEEE International, Nov. 16-18, 2010, 6 pages.
Tecnisco, Ltd.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/US2021037375.
PCT International Search Report and Written Opinion dated Oct. 19, 2021, for International Application No. PCT/US2021/038690.
PCT International Search Report and Written Opinion dated Feb. 4, 2022, for International Application No. PCT/US2021/053830.
PCT International Search Report and Written Opinion dated Feb. 4, 2022, for International Application No. PCT/US2021/053821.
Japanese Office Action dated Feb. 27, 2024 for Application No. 2023-501778.
Korean Office Action dated Aug. 28, 2024 for Application No. 10-2023-7004245.
European Search Report dtd Aug. 20, 2024 for EP 21841312.8.
Taiwan Office Action dated Mar. 7, 2025 for Application No. 110125623.

\* cited by examiner

METHOD AND APPARATUS FOR LASER DRILLING BLIND VIAS

CROSS-REFERENCES TO RELATED APPLICATIONS

This application is a continuation application of co-pending application Ser. No. 16/928,252, entitled "Method and Apparatus for Laser Drilling Blind Vias" and filed Jul. 14, 2020, which is herein incorporated by reference in its entirety.

FIELD

Embodiments of the present disclosure generally relate to methods and apparatus for drilling blind vias.

DESCRIPTION OF THE RELATED ART

With increasing demand for miniaturized electronic devices and components, the demand for faster processing capabilities with greater circuit densities imposes demands on the materials, structures, and processes used in the fabrication of integrated circuit chips and printed circuit boards. Incorporating blind vias enable more connections and greater circuit density. Laser drilling is an established method for forming blind vias.

Alongside the trend toward smaller vias, e.g., diameters from 5 µm to 10 µm, for higher interconnect density, certain blind via quality parameters remain. These include via top diameter and roundness, via bottom diameter and roundness, via taper angle (80° or more), and via pad cleanliness. However, conventional laser-drilling technologies cannot form quality blind vias having such small diameters for high-volume manufacturing.

Conventional approaches for laser drilling blind vias use nanosecond-pulsed 355 nm ultraviolet (UV) lasers or pulsed $CO_2$ lasers to directly drill blind vias in panels. However, both these approaches require complex beam shaping optics to convert the Gaussian laser beam profile emitted by the laser sources into a top-hat shaped beam profile. Further, top-hat shaped laser beam profiles generally have a very short depth-of-field within which the laser beam profile remains equal in intensity. Moreover such top-hat beam profiles are not capable of drilling diameters less than 40 µm, particularly 5 µm to 10 µm, in a consistent and cost-effective manner. Moreover, conventional laser drilling methods cannot enable blind vias having a taper angle of 80° or more.

There is a need for new and improved methods and apparatus for drilling high-quality, small-diameter blind vias in high volumes.

SUMMARY

Embodiments of the present disclosure generally relate to methods and apparatus for drilling blind vias.

In an embodiment, a method of forming a blind via in a substrate is provided. The method includes conveying the substrate to a scanning chamber of a laser drilling system, the substrate comprising a conductive layer, a dielectric layer disposed on at least a portion of the conductive layer, and a mask layer disposed on at least a portion of the dielectric layer. The method further includes detecting the mask layer by a sensor of the laser drilling system, the mask layer providing a substrate surface, and determining one or more properties of the blind via, the one or more properties comprising: a top diameter of the blind via and a bottom diameter of the blind via, the blind via having a height from the top diameter to bottom diameter, the top diameter being greater than the bottom diameter; a volume of the blind via, the volume corresponding to the top diameter, the bottom diameter, and the height; or a taper angle of about 80 degrees or more. The method further includes focusing a Gaussian laser beam emitted from a laser source of the laser drilling system, under laser process parameters, at the substrate surface to remove at least a portion of the mask layer. The method further includes adjusting the laser process parameters based on the one or more properties, and focusing the Gaussian laser beam, under the adjusted laser process parameters, to remove at least a portion of the dielectric layer within the volume to form the blind via.

In another embodiment, a method of forming a blind via in a substrate is provided. The method includes conveying the substrate to a scanning chamber of a laser drilling system, the substrate comprising a conductive layer of about 2 µm or more in height, a dielectric layer disposed on at least a portion of the conductive layer, and a pre-etched mask layer disposed on at least a portion of the dielectric layer, the pre-etched mask layer having blind via openings to expose at least a portion of the dielectric layer, the at least a portion of the dielectric layer providing a substrate surface. The method further includes detecting the blind via openings of the pre-etched mask layer by a sensor of the laser drilling system, and determining one or more properties of the blind via, the one or more properties of the blind via comprising: a top diameter of the blind via and a bottom diameter of the blind via, the blind via having a height from the top diameter to bottom diameter, the top diameter being greater than the bottom diameter, and the top diameter corresponding to the blind via openings; a volume of the blind via, the volume corresponding to the top diameter, the bottom diameter, and the height; or a taper angle of 80 degrees or more. The method further includes focusing a Gaussian laser beam emitted from a laser source of the laser drilling system, under laser process parameters, at the substrate surface to remove a first portion of the dielectric layer within the volume of the blind via without causing more than half of the thickness of mask layer damage to the pre-etched mask layer. The method further includes adjusting the laser process parameters based on the one or more properties, and focusing the Gaussian laser beam, under the adjusted laser process parameters, to remove a second portion of the dielectric layer within the volume to form the blind via.

In an embodiment, an apparatus for forming a blind via in a substrate is provided. The apparatus includes an optical device comprising a galvanometer scanner having a plurality of reflecting facets and an axis of rotation, and a beam expander and collimator. The apparatus further includes a femtosecond laser beam source configured to direct electromagnetic radiation to the beam expander and configured to emit a Gaussian laser beam, a transport assembly configured to position the substrate to receive the electromagnetic radiation reflected from at least one of the reflecting facets of the galvanometer scanner, and a height sensor configured to detect a height of a mask layer disposed on at least a portion of the substrate. The apparatus further includes a controller configured to receive signals from the height sensor and to control the femtosecond beam laser source and the transport assembly based on the signals received from the height sensor.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

Figure 1A:
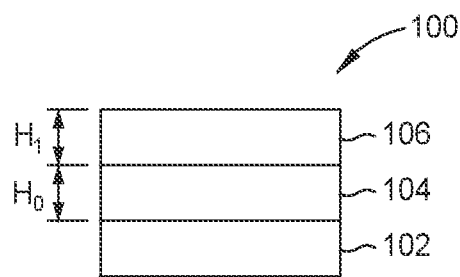
FIG. 1A is an example substrate according to at least one embodiment of the present disclosure.

Embodiments of the present disclosure generally relate to methods and apparatus for drilling blind vias. The inventors have discovered a method and apparatus to laser drill blind vias in a panel that includes a conductive layer and an insulating layer. Unlike conventional laser drilling methods and apparatus, the method and apparatus described herein can enable formation of blind vias having taper angles greater than about 80°, and can enable formation of blind vias having diameters of less than about 40 μm, such as about 5 μm to about 10 μm. The methods and apparatus herein enable formation of quality blind vias for high-volume manufacturing.

Alongside the trend toward smaller diameter blind vias, e.g., diameters from 5 μm to 10 μm, for higher interconnect density, certain blind via quality parameters remain. These include via top diameter and roundness, via bottom diameter and roundness, via taper angle (80° or more), and via pad cleanliness. However, conventional laser-drilling technologies cannot form quality blind vias having such small diameters for high volume manufacturing.

Conventional approaches for laser drilling blind vias use nanosecond-pulsed 355 nm ultraviolet (UV) lasers or pulsed CO2 lasers to directly drill blind vias in panels. These approaches have certain limitations. First, the Gaussian laser beam profile emitted by the laser sources requires complex beam-shaping optics to convert the beam into a top-hat shaped beam profile. Second, the beam-shaping optics employed result in about 40% optical energy loss. Third, the intensity profile of the top-hat shaped beam has a very short depth-of-field (DOF) within which the laser beam profile remains equal in intensity. Here, the intensity profile of the output top-hat beam deforms/degrades quickly from the image plane along the beam propagation axis because of its non-uniform phase distribution, which limits its application in imaging with large DOF. A smaller diameter top-hat image beam has a shorter DOF, and as the DOF becomes shorter than the variation range of panel thickness/chuck flatness, it is difficult to ensure that the top-hat beam always intersects the panel surface on each via drilling location, so the via quality is inconsistent, particularly for high-volume manufacturing. This inability to achieve consistent via quality at higher throughput is not cost-effective. Another conventional method employs a deep ultraviolet (DUV) light excimer laser with a wavelength of 193 to 308 nm. A mask projection converts the laser beam to a top-hat shaped beam profile. This method also has certain limitations. First, the equipment, e.g., laser and optics, and maintenance thereon can be expensive. Second, the intensity profile of the top-hat shaped beam has a very short DOF, thereby limiting its application. Third, the mask is consumable. The methods and apparatus described herein can eliminate (or at least mitigate) the aforementioned deficiencies of conventional approaches to laser drill blind vias.

Substrate

FIG. 1A is an example substrate 100 according to at least one embodiment. The example substrate 100 can be utilized for structural support and electrical interconnection of semiconductor packages. The example substrate 100 generally includes a core structure 102, a conductive layer 104, and an insulating layer 106.

In at least one embodiment, the core structure 102 includes a patterned (e.g., structured) substrate formed of any suitable substrate material. For example, the core structure 102 can include a substrate formed from a III-V compound semiconductor material, silicon, crystalline silicon (e.g., Si<100> or Si<111>), silicon oxide, silicon germanium, doped or undoped silicon, doped or undoped polysilicon, silicon nitride, quartz, glass (e.g., borosilicate glass), sapphire, alumina, and/or ceramic materials. In at least one embodiment, the core structure 102 includes a monocrystalline p-type or n-type silicon substrate. In some embodiments, the core structure 102 includes a polycrystalline p-type or n-type silicon substrate. In another embodiment, the core structure 102 includes a p-type or an n-type silicon solar substrate. The substrate utilized to form the core structure 102 can further have a polygonal or circular shape. For example, the core structure 102 can include a substantially square silicon substrate having lateral dimensions from about 120 to and about 180 mm, with or without chamfered edges. In another example, the core structure 102 includes a circular silicon-containing wafer having a diameter from about 20 mm to about 700 mm, such as from about 100 mm to about 50 mm, for example about 300 mm.

The conductive layer 104 is formed on one or more surfaces of the core structure 102. The conductive layer 104 can be formed of a metallic material, such as copper (Cu), tungsten (W), chromium (Cr), molybdenum (Mo), aluminum (Al), gold (Au), nickel (Ni), palladium (Pd), or the like, or a combination thereof. In at least one embodiment, the conductive layer includes a layer of tungsten on copper. In at least one embodiment, the conductive layer 104 has a height $H_0$ that is about 100 μm or less, such as about 50 μm or less, such as 25 μm or less. For example, the conductive layer 104 can have a height $H_0$ from about 5 μm to about 20 μm, such as a height $H_0$ from about 7 μm to about 18 μm, such as from about 10 μm to about 15 μm. In at least one embodiment, the height $H_0$ ranges from $H_{0a}$ to $H_{0b}$, where $H_{0a}$ to $H_{0b}$ can be, independently, e.g., about 1 μm, about 2 μm, about 3 μm, about 4 μm, about 5 μm, about 6 μm, about 7 μm, about 8 μm, about 9 μm, about 10 μm, about 11 μm, about 12 μm, about 13 μm, about 14 μm, about 15 μm, about 16 μm, about 17 μm, about 18 μm, about 19 μm, or about 20 μm, as long as $H_{0a} < H_{0b}$.

The insulating layer 106 is formed on one or more surfaces of the conductive layer 104. In at least one embodiment, the insulating layer 106 is formed of polymer-based dielectric materials. For example, the insulating layer 106 is formed from a flowable build-up material, typically in the form of a dry film. Accordingly, although hereinafter referred to as an "insulating layer," the insulating layer 106 can also be described as a dielectric layer. In some embodiments, the insulating layer 106 is formed of an epoxy resin material having a ceramic filler, such as silica ($SiO_2$) particles. Other examples of ceramic fillers that can be utilized to form the insulating layer 106 include aluminum nitride (AlN), aluminum oxide ($Al_2O_3$), silicon carbide (SiC), silicon nitride ($Si_3N_4$), $Sr_2Ce_2Ti_5O_{16}$, zirconium silicate (ZrSiO$_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the insulating layer 106 have particles ranging in size between about 40 nm and about 1.5 μm, such as between about 80 nm and about 1 μm. For example, the ceramic fillers have particles ranging in size between about 200 nm and about 800 nm, such as between about 300 nm and about 600 nm. In some embodiments, the insulating layer is a polymer with or without particle reinforcement. The insulating layer can be a dry dielectric film or a liquid dielectric film.

In at least one embodiment, the insulating layer 106 has a height $H_1$ that is about 100 μm or less, such as about 50 μm or less, such as 25 μm or less. For example, the insulating layer 106 can have a height $H_0$ from about 5 μm to about 20 μm, such as a height $H_1$ from about 7 μm to about 18 μm, such as from about 10 μm to about 15 μm. In at least one embodiment, the height $H_1$ ranges from $H_{1a}$ to $H_{1b}$, where $H_{1a}$ to $H_{1b}$ can be, independently, e.g., about 1 μm, about 2 μm, about 3 μm, about 4 μm, about 5 μm, about 6 μm, about 7 μm, about 8 μm, about 9 μm, about 10 μm, about 11 μm, about 12 μm, about 13 μm, about 14 μm, about 15 μm, about 16 μm, about 17 μm, about 18 μm, about 19 μm, or about 20 μm, as long as $H_{1a} < H_{1b}$.

Figure 1B:
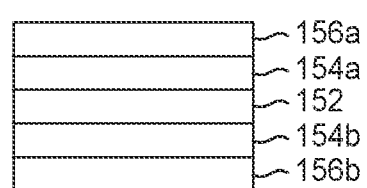
FIG. 1B is an example substrate according to at least one embodiment of the present disclosure.

FIG. 1B is an example substrate 150 according to at least one embodiment. The example substrate 150 can be utilized for structural support and electrical interconnection of semiconductor packages. The example substrate 150 generally includes a core structure 152, conductive layers 154a, 154b formed on opposing surfaces of the core structure 152, an insulating layer 156a formed on a surface of the conductive layer 154a, and an insulating layer 156b formed on a surface of the conductive layer 154b. Example properties and characteristics of the core structure 152, conductive layers 154a, 154b, and insulating layers 156a, 156b are similar to those described above with respect to the core structure 102, conductive layer 104, and insulating layer 106, respectively.

Figure 1C:
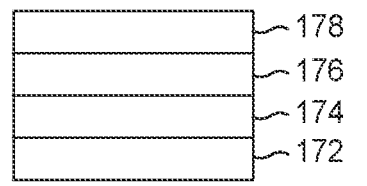
FIG. 1C is an example substrate with a blank mask layer according to at least one embodiment of the present disclosure.

FIG. 1C is an example substrate 170 with a blank mask layer (e.g., not pre-etched) according to at least one embodiment. The example substrate 170 can be utilized for structural support and electrical interconnection of semiconductor packages. The example substrate 170 generally includes a core structure 172, a conductive layer 174 formed on a surface of the core structure 172, an insulating layer 176 formed on a surface of the conductive layer 174, and a mask layer 178 formed on a surface of the insulating layer 176. Example properties and characteristics of the core structure 172, conductive layer 174, and insulating layer 176 are similar to those described above with respect to the core structure 102, conductive layer 104, and insulating layer 106, respectively.

In at least one embodiment, the mask layer 178 comprises Al, Cu, W, Mo, Cr, or a combination thereof. In some embodiments the mask layer (with or without openings) has a height $H_2$ of about 2 μm or less, such as from about 0.03 μm to about 2 μm or from about 0.05 μm to about 1 μm. In at least one embodiment, the height $H_2$ ranges from $H_{2a}$ to $H_{2b}$, where $H_{2a}$ to $H_{2b}$ can be, independently, e.g., about 0.1 μm, about 0.2 μm, about 0.3 μm, about 0.4 μm, about 0.5 μm, about 0.6 μm, about 0.7 μm, about 0.8 μm, about 0.9 μm, about 1 μm, about 1.1 μm, about 1.2 μm, about 1.3 μm, about 1.4 μm, about 1.5 μm, about 1.6 μm, about 1.7 μm, about 1.8 μm, about 1.9 μm, or about 2 μm, as long as $H_{2a} < H_{2b}$.

The mask layer 178 can be formed by, e.g., deposition, sputter, or electrical plating. In at least one embodiment, the mask layer is laser ablated. In some embodiments, the mask layer 178 is removed by an etching operation after the blind via has been formed by processes described herein. In some embodiments, such as when the mask layer 178 is Mo and/or W, the mask is maintained after the blind via has been formed and is combined with a to-be-deposited conductive layer (e.g., Cu) to function as an interconnect layer.

In at least one embodiment, and referring again to FIG. 1B, the example substrate includes a mask on a surface of insulating layer 156a and/or a surface of insulating layer 156b. The mask layer can be blank or pre-etched to form via openings. Characteristics of each mask layer are similar to that described above in relation to mask layer 178.

Figure 1D:
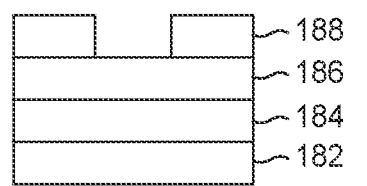
FIG. 1D illustrates an example substrate with a pre-etched mask layer according to at least one embodiment of the present disclosure.

FIG. 1D is an example substrate 180 with a pre-etched (or pre-opened) mask layer according to at least one embodiment. Here, the example substrate 180 is pre-etched to form via openings. The example substrate 180 can be utilized for structural support and electrical interconnection of semiconductor packages. The example substrate 180 generally includes a core structure 182, a conductive layer 184 formed on a surface of the core structure 182, an insulating layer 186 formed on a surface of the conductive layer 184, and a mask layer 188 formed on a surface of the insulating layer 186.

Example properties and characteristics of the core structure 182, conductive layer 184, and insulating layer 186 are similar to those described above with respect to the core structure 102, conductive layer 104, and insulating layer 106, respectively. Example properties and characteristics of the mask layer 188 are similar to those of mask layer 178 described above.

Figure 2A:
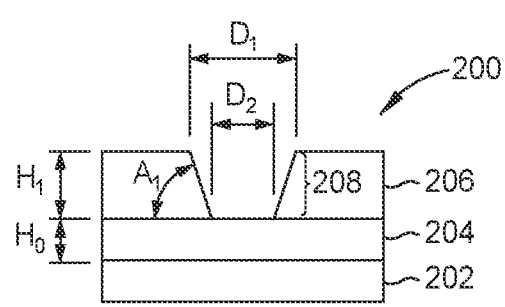
FIG. 2A is an example substrate after forming a blind via according to at least one embodiment of the present disclosure.

FIG. 2A is an example substrate 200 after forming a blind via in the example substrate 100 (shown in FIG. 1A) according to at least one embodiment. The example substrate 200 generally includes a core structure 202, a conductive layer 204, and an insulating layer 206. The blind via 208 extends from a surface of the insulating layer 206 to the conductive layer 204. The blind via 208 has a top diameter $D_1$, a bottom diameter $D_2$, a taper angle ($A_1$), and a volume $V_1$. In some embodiments, the blind via 208 penetrates, or minimally penetrates, the conductive layer 204. In some embodiments, the blind via does not penetrate, or substantially does not penetrate, the conductive layer 204.

The diameters of the top diameter $D_1$ and the bottom diameter $D_2$ can be about 20 μm or less, such as about 15 μm or less, such as from about 5 μm to about 10 μm. In at least one embodiment, the top diameter $D_1$ ranges from $D_{1a}$ to $D_{1b}$, where $D_{1a}$ to $D_{1b}$ can be, independently, e.g., about 1 μm, about 2 μm, about 3 μm, about 4 μm, about 5 μm, about 6 μm, about 7 μm, about 8 μm, about 9 μm, about 10 μm, about 11 μm, about 12 μm, about 13 μm, about 14 μm, about 15 μm, about 16 μm, about 17 μm, about 18 μm, about 19 μm, or about 20 μm, as long as $D_{1a}<D_{1b}$. In at least one embodiment, the bottom diameter $D_2$ ranges from $D_{2a}$ to $D_{2b}$, where $D_{2a}$ to $D_{2b}$ can be, independently, e.g., about 1 μm, about 2 μm, about 3 μm, about 4 μm, about 5 μm, about 6 μm, about 7 μm, about 8 μm, about 9 μm, about 10 μm, about 11 μm, about 12 μm, about 13 μm, about 14 μm, about 15 μm, about 16 μm, about 17 μm, about 18 μm, about 19 μm, or about 20 μm, as long as $D_{2a}<D_{2b}$.

In some embodiments, the bottom diameter $D_2$ is less than the top diameter $D_1$, such that the blind via has a taper. The taper corresponds to a ratio of the bottom diameter $D_2$ to top diameter $D_1$. In at least one embodiment, the ratio of the bottom diameter $D_2$ to the top diameter $D_1$ is from about $0.353*H_{IL}$ (where $H_{IL}$ is the height of the insulating layer, e.g., insulating layer 206) to about 1, such as from about $0.4*H_1$ to about 1, such as from about $0.5*H_1$ to about 1.

In at least one embodiment, the blind via 208 has a taper angle $A_1$ which corresponds to the angle between the interior wall of the blind via 208 and a surface of the conductive layer 204. In at least one embodiment, the taper angle $A_1$ is from about 75° to 90°, such as from about 80° to about 89°. In at least one embodiment, the taper angle $A_1$ ranges from $A_{1a}$ to $A_{1b}$, where $A_{1a}$ to $A_{1b}$ can be, independently, e.g., about 71°, about 72°, about 73°, about 74°, about 75°, about 76°, about 77°, about 78°, about 79°, about 80°, about 81°, about 82°, about 83°, about 84°, about 85°, about 86°, about 87°, about 88°, about 89°, or about 90°, as long as $A_{1a}<A_{1b}$.

Figure 2B:
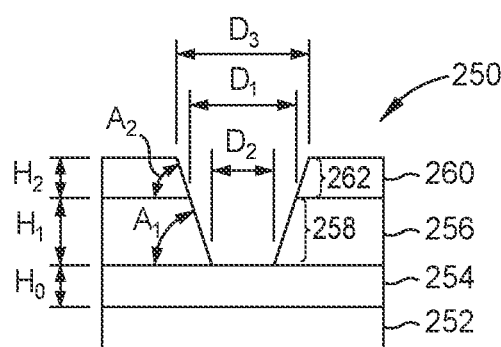
FIG. 2B is an example substrate after forming a blind via in a substrate having a blank mask layer according to at least one embodiment of the present disclosure.

FIG. 2B is an example substrate 250 after forming a blind via in the example substrate 170 having a blank mask (shown in FIG. 1C) according to at least one embodiment. The example substrate 250 generally includes a core structure 252, a conductive layer 254, an insulating layer 256, and a mask layer 260. The blind via is shown by reference numeral 258. Characteristics of core structure 252, conductive layer 254, insulating layer 256, height $H_0$, height $H_1$, diameter $D_1$, diameter $D_2$, and taper angle $A_1$ are similar to those described above. Angle $A_2$ can correspond substantially to taper angle $A_1$ and/or can have similar characteristics of taper angle $A_1$. In at least one embodiment, $A_2$ is equal to or smaller than $A_1$. In at least one embodiment, the taper angle $A_2$ ranges from $A_{2a}$ to $A_{2b}$, where $A_{2a}$ to $A_{2b}$ can be, independently, e.g., about 71°, about 72°, about 73°, about 74°, about 75°, about 76°, about 77°, about 78°, about 79°, about 80°, about 81°, about 82°, about 83°, about 84°, about 85°, about 86°, about 87°, about 88°, about 89°, or about 90°, as long as $A_{2a}<A_{2b}$.

In some embodiments, diameter $D_3$ of mask layer 260 is about equal to diameter $D_1$ or larger, such as from about diameter $D_1$ to about diameter $D_1+5$ um, such as about diameter $D_1+4$ μm, about diameter $D_1+3$ μm, about diameter $D_1+2$ μm, or about diameter $D_1+1$ μm. In at least one embodiment, diameter $D_3 \geq$ diameter $D_1 \geq$ diameter $D_2$. The blind via can correspond to reference numeral 258 when the mask layer is removed from the substrate after processing, or can correspond to numeral 262 when the mask layer is maintained on the substrate after processing.

Figure 2C:
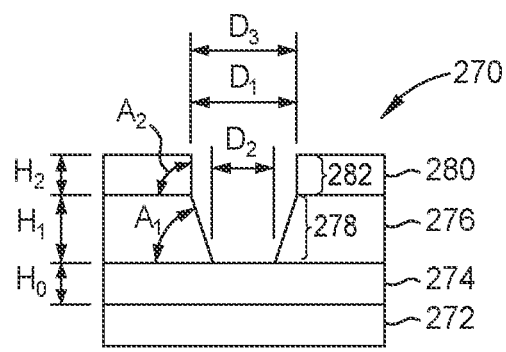
FIG. 2C is an example substrate after forming a blind via in a substrate having a pre-etched mask layer according to at least one embodiment of the present disclosure.

FIG. 2C is an example substrate 270 after forming a blind via in the example substrate 180 having a pre-etched/pre-opened mask (shown in FIG. 1D) according to at least one embodiment. The example substrate 270 generally includes a core structure 272, a conductive layer 274, an insulating layer 276, and a mask layer 280. The blind via is shown by reference numeral 278. Characteristics of core structure 272, conductive layer 274, insulating layer 276, height $H_0$, height $H_1$, diameter $D_1$, diameter $D_2$, taper angle $A_1$, and taper angle $A_2$ are similar to those described above. In at least one embodiment, taper angle $A_2$ is substantially 90° or corresponds substantially to taper angle $A_1$. In at least one embodiment, taper angles $A_1$ and $A_2$ are, independently, e.g., about 71°, about 72°, about 73°, about 74°, about 75°, about 76°, about 77°, about 78°, about 79°, about 80°, about 81°, about 82°, about 83°, about 84°, about 85°, about 86°, about 87°, about 88°, about 89°, or about 90°. Taper angle $A_1$ can be equal to, less than, or greater than taper angle $A_2$. Diameter $D_3$ (in units of μm) of mask layer 280 can be about $(D_1+H_2)$ or less, such as from about $D_1$ to about $(D_1+(¼)H_2)$, such as from about $D_1$ to about $(D_1+(⅓)H_2)$, such as from about $D_1$ to about $(D_1+(½)H_2)$. In at least one embodiment, diameter $D_3 \geq$ diameter $D_1$. The blind via can correspond to reference numeral 278 when the mask layer is removed from the substrate after processing, or can correspond to numeral 282 when the mask layer is maintained on the substrate after processing.

In some embodiments, the allowable variation range of taper angle $A_2$ is wider than that of taper angle $A_1$, e.g., 70°≤$A_2$≤90°, 75°≤$A_1$≤90°. In some examples, 80°≤$A_1$ for 5-10 μm diameter vias; for larger than 10 μm vias, 75°≤$A_1$.

In at least one embodiment, the mask layer (with or without openings) has a height of about 2 μm or less, such as from about 0.03 μm to about 2 μm or from about 0.05 μm to about 1 μm.

The mask layers described herein can be opened by photolithography. In some embodiments, a photoresist layer is applied on top of the metal mask. The photoresist layer can be patterned by photolithography to define the sizes and locations of via openings on the metal mask layer. The opening on the metal mask layer can be formed by etching processes, such as a plasma etch and a wet chemical etch. Lithography-defined openings can allow for relaxed positional accuracies and can permit improved laser throughput. Processes Embodiments described herein also include processes for laser drilling blind vias. The laser source for laser drilling blind vias can be a femtosecond laser. Suitable femtosecond-based laser processes can be characterized by a high peak intensity (irradiance) that usually leads to nonlinear interactions in various materials.

Figure 3:
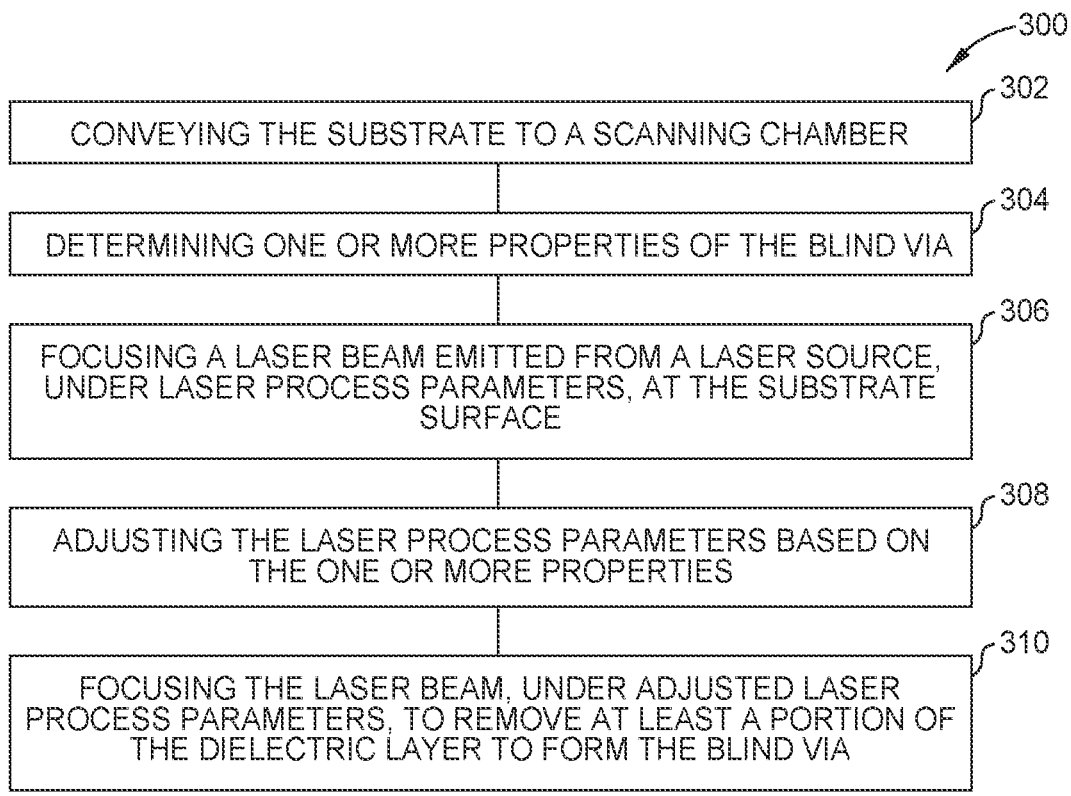
FIG. 3 is an example method of forming a blind via in a substrate according to at least one embodiment of the present disclosure.

FIG. 3 shows an example method 300 of forming a blind via in a substrate according to at least one embodiment. In at least one embodiment, example method 300 is used on a substrate having a mask layer with no openings (i.e., blank). The example method 300 includes conveying the substrate to a scanning chamber at operation 302. Here, the substrate can include a conductive layer (e.g., a copper layer), a dielectric layer disposed on at least a portion of the conductive layer, and a mask layer disposed on at least a portion of the dielectric layer, the mask layer providing a substrate surface. The example method 300 further includes determining one or more properties of the blind via at operation 304. The one or more properties can include a top diameter of the blind via, a bottom diameter of the blind via, a height of the blind via, a volume of the blind via, and a taper angle of the blind via. In at least one embodiment, the taper angle is greater than 75° or greater than 80° as described above. In some embodiments, the top diameter is greater than the bottom diameter, and the top diameter corresponds to the blind via opening. The volume of the blind via corresponds to the top diameter, the bottom diameter, and the height. The example method 300 further includes focusing a laser beam emitted from a laser source, under laser process parameters, at the substrate surface at operation 306. This operation can result in removing a first portion of the dielectric layer within the volume, while only causing gentle melting and polishing on the surface of the conductive layer underneath the dielectric layer, with the ablation depth in the conductive layer no more than, e.g., about 2 µm. In some embodiments, operation 306 results in removing about half of the thickness of the mask layer or less. Accordingly, and in some embodiments, the conductive layer has no substantial damage after operation 306.

The example method 300 further includes adjusting the laser process parameters based on the one or more properties at operation 308. In some embodiments, the laser process parameters include a laser power, a laser energy in a burst, a focal beam diameter, a focus height, a burst energy, a pulse energy, a number of pulses in a burst, a pulse frequency, a burst frequency, a beam spot size, an $M^2$ value, an offset of beam focusing from substrate surface (either above and/or below the substrate surface), or a combination thereof. $M^2$ is a unitless laser beam spatial characteristic. It measures the difference between an actual laser beam and a Gaussian beam. These and other laser process parameters are described below. The example method 300 further includes focusing the laser beam, under adjusted laser process parameters, to remove at least a portion of the dielectric layer within the volume to form the blind via at operation 310.

In some embodiments, further operations are performed such as removing the mask layer from the substrate. In at least one embodiment, and when the mask layer comprises Mo and/or W, a further operation includes depositing a layer of copper on the mask layer.

Figure 4:
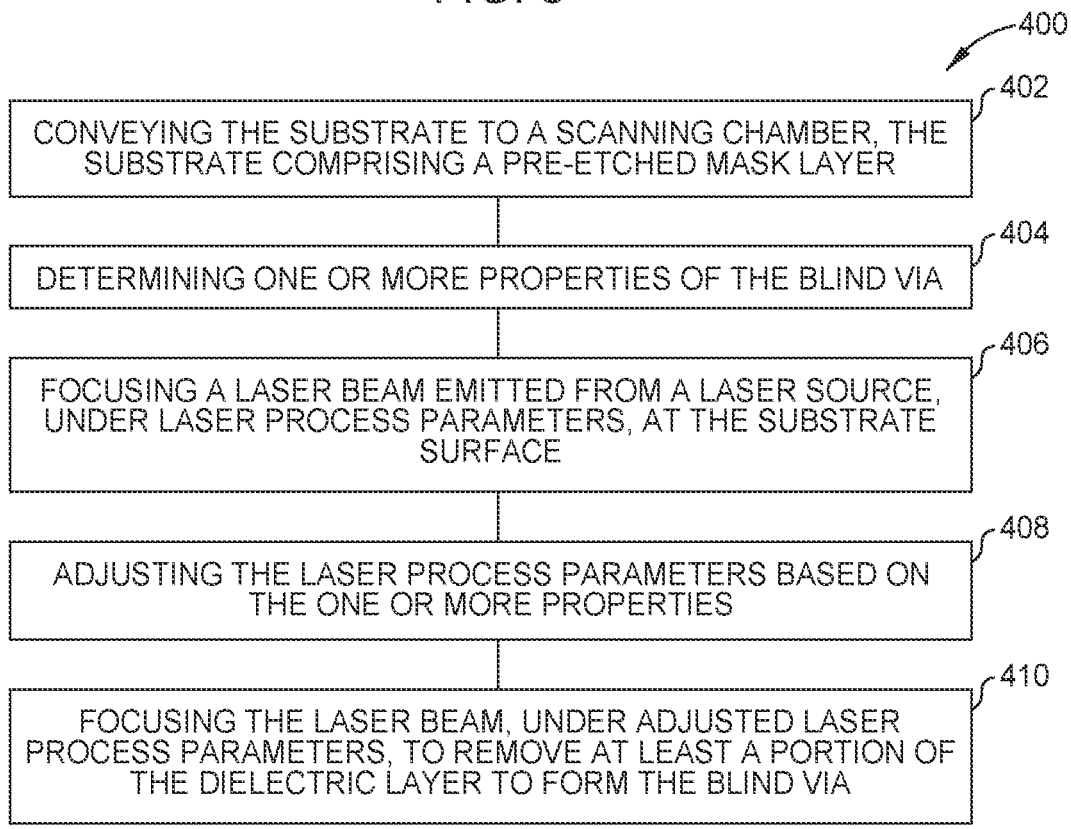
FIG. 4 is an example method of forming a blind via in a substrate according to at least one embodiment of the present disclosure.

FIG. 4 shows an example method 400 of forming a blind via in a substrate according to at least one embodiment. In at least one embodiment, example method 400 is used to form a blind via on a substrate having a pre-etched mask layer. The example method 400 includes conveying the substrate to a scanning chamber at operation 402. Here, the substrate can include a conductive layer (e.g., a copper layer), a dielectric layer disposed on at least a portion of the conductive layer, and a pre-etched mask layer disposed on at least a portion of the dielectric layer, the pre-etched mask layer having blind via openings to expose at least a portion of the dielectric layer and the dielectric layer providing a substrate surface. The example method 400 further includes determining one or more properties of the blind via at operation 404. The one or more properties can include a top diameter of the blind via, a bottom diameter of the blind via, a height of the blind via, a volume of the blind via, and a taper angle of the blind via. In at least one embodiment, the taper angle is greater than 75° or greater than 80° as described above. In some embodiments, the top diameter is greater than the bottom diameter, and the top diameter corresponds to the blind via opening. The volume of the blind via corresponds to the top diameter, the bottom diameter, and the height. The example method 400 further includes focusing a laser beam emitted from a laser source, under laser process parameters, at the substrate surface at operation 406. This operation can result in removing a first portion of the dielectric layer within the volume, and can be performed without causing substantial damage to the pre-etched mask layer and/or without causing substantial damage to the conductive layer. "Without substantial damage to the pre-etched mask layer" refers to slightly melting the mask layer as to "shine/polish" mask surface but no visible ablation induced material removal from mask surface as to cause top via diameter change or induce oval shape of via. The mask is a sacrificial layer that can be removed. In at least one embodiment, the tolerable mask damage depends on the mask height. As a non-limiting example, if the mask height is about 0.3 µm, the damage/ablation depth into the mask should be less than about 0.3 µm. As another non-limiting example, if the mask height is about 2 µm, the damage/ablation depth into the mask should be less than about 2 µm.

The example method 400 further includes adjusting the laser process parameters based on the one or more properties at operation 408. In some embodiments, the laser process parameters include a laser power, a laser energy in a burst, a focal beam diameter, a focus height, a burst energy, a pulse energy, a number of pulses in a burst, a pulse frequency, a burst frequency, a beam spot size, an $M^2$ value, an offset of beam focusing from substrate surface, or a combination thereof. These and other laser process parameters are described below. The example method 400 further includes focusing the laser beam, under adjusted laser process parameters, to remove at least a portion of the dielectric layer within the volume to form the blind via at operation 410.

In some embodiments, further operations are performed, such as removing the pre-etched mask layer from the substrate. In at least one embodiment, and when the pre-etched mask layer comprises Mo and/or W, a further operation includes depositing a layer of copper on the pre-etched mask layer.

The femtosecond laser source (such as an ultraviolet laser) used in at least some embodiments herein has a number of adjustable characteristics (laser process parameters) as described below. In at least one embodiment, the laser process parameters include one or more of the following characteristics:

(1) The femtosecond laser source has a pulse width or pulse width range from about 1 femtosecond (fs) to about 1000 fs, such as from about 100 fs to about 750 fs, such as from about 200 fs to about 500 fs.

(2) The femtosecond laser source has a wavelength or wavelength range from about 250 nanometers (nm) to about 2000 nm, such as from about 266 nm to about 1500 nm, such as from about 350 nm to about 540 nm.

In at least one embodiment, the femtosecond laser source has a wavelength of about 400 nm or lower.

(3) The femtosecond laser source and corresponding optical system provide a focal spot or focal spot range at the work surface in the range from about 1.5 microns (μm) to about 12 μm, such as from about 3 μm to about 10 μm, such as from about 4 μm to about 8 μm. The spatial beam profile at the work surface can be a single mode (Gaussian) profile.

(4) The femtosecond laser source outputs bursts of pulses. Within each burst, the pulse frequency or range of pulse frequency is about 500 MHz or more, such as about 1 GHz or more, such as 2 GHz or more, such as from about 1 GHz to about 10 GHz, such as from about 2 GHz to about 9 GHz, such as from about 3 GHz to about 8 GHz, such as from about 4 GHz to about 7 GHz, such as from about 5 GHz to about 6 GHz. In at least one embodiment, the pulse frequency or range of pulse frequency within each burst is from about 2 GHz to about 5 GHz.

(5) The number of pulses in each burst outputted from the femtosecond laser source can be adjusted. The number of pulses in each burst can be about 2 or more, or about 3 or more, such as from about 5 to about 100, such as from about 10 to about 100, such as from about 20 to about 90, such as from about 40 to about 80, such as from about 50 to about 70, such as from about 55 to about 65. In at least one embodiment, the number of pulses in each burst is from about 20 to about 100.

(6) The burst frequency can be adjusted. The burst frequency of the femtosecond laser source can be about 100 kHz or more, such as about 500 kHz or more. In at least one embodiment, the burst frequency is from about 200 kHz to about 5 MHz or from about 500 kHz to about 5 MHz, such as from about 300 kHz to about 2 MHz, from about 1 MHz to about 2 MHz, or from about 500 kHz to about 1 MHz.

(7) The femtosecond laser source delivers an amount of laser energy in a burst from about 1 μJ to about 100 μJ, such as from about 1 μJ to about 80 μJ, such as from about 3 μJ to about 50 μJ, such as from about 5 μJ to about 20 μJ. In at least one embodiment, the laser and the burst frequency are set to achieve an amount of laser energy in a burst that can be about 5 μJ or more, such as from about 5 μJ to about 50 μJ, such as from about 10 μJ to about 30 μJ.

(8) The laser power of the femtosecond laser source is about 1 W or more, such as from about 1 W to about 100 W, such as from about 5 W to about 80 W, such as from about 10 W to about 50 W.

(9) The $M^2$ value that characterizes laser beam quality is about 1.5 or less ($M^2$ is always 1.0), such as from about 1 to about 1.3, such as from about 1.1 to about 1.2, or from about 1 to about 1.15, or from about 1 to about 1.1.

(10) The focal beam diameter can be from about 2 μm to about 10 μm, such as from about 3 μm to about 6 μm for drilling 5 μm diameter vias. The focal beam diameter can be from about 7 μm to about 12 μm, such as from about 8 to about 11 μm for drilling 10 μm diameter vias. The focal beam diameter is the laser beam spot diameter at the work surface, which is the result of the output laser beam going through a beam expander and then being focused by a focusing lens.

(11) The offset of beam focusing from a substrate, which is also called the focus height, is from about 0 μm to 100 μm, such as from about 0 μm to about 50 μm, such as from about 0 μm to about 30 μm. Focus height is an adjustable parameter. In some embodiments, for example, the focal spot is set right on the panel surface to cut through the mask and remove some of the insulating layer material, and then the focus height is adjusted so that the focal plane is above the panel surface—that is, to set the laser beam intersecting panel surface off-focus to get a lower fluence that can only remove the insulating layer material but not damage mask layer and conductive layer at the via bottom.

(12) The number of bursts are about 2 or more, such as from about 5 to about 20.

(13) The focused beam spot size is about 80% to about 120% of the targeted entry diameter of the hole at the dielectric surface (e.g., entry diameter $D_1$ of the hole to be drilled as defined in FIG. 2C or the diameter $D_1$ of the hole to be drilled as defined in FIG. 2B), such as from about 90% to about 110%, such as from about 95% to about 100%.

The focused beam diameter can be adjustable using a programmable beam expander to drill different diameter vias.

The femtosecond laser source can be an electromagnetic radiation source such as a diode-pumped solid state (DPSS) laser or other similar radiation emitting sources that can provide and emit a continuous or pulsed beam. According to the lasing medium (crystal) configuration, and in at least one embodiment, the DPSS lasers can be a rod crystal laser, a fiber laser, a disc laser, a rod-type photonic crystal fiber laser, an innoslab laser, or a hybrid of them. In some embodiments, the laser source includes multiple laser diodes, each of which produces uniform and spatially coherent light at the same wavelength.

Apparatus

Figure 6A:
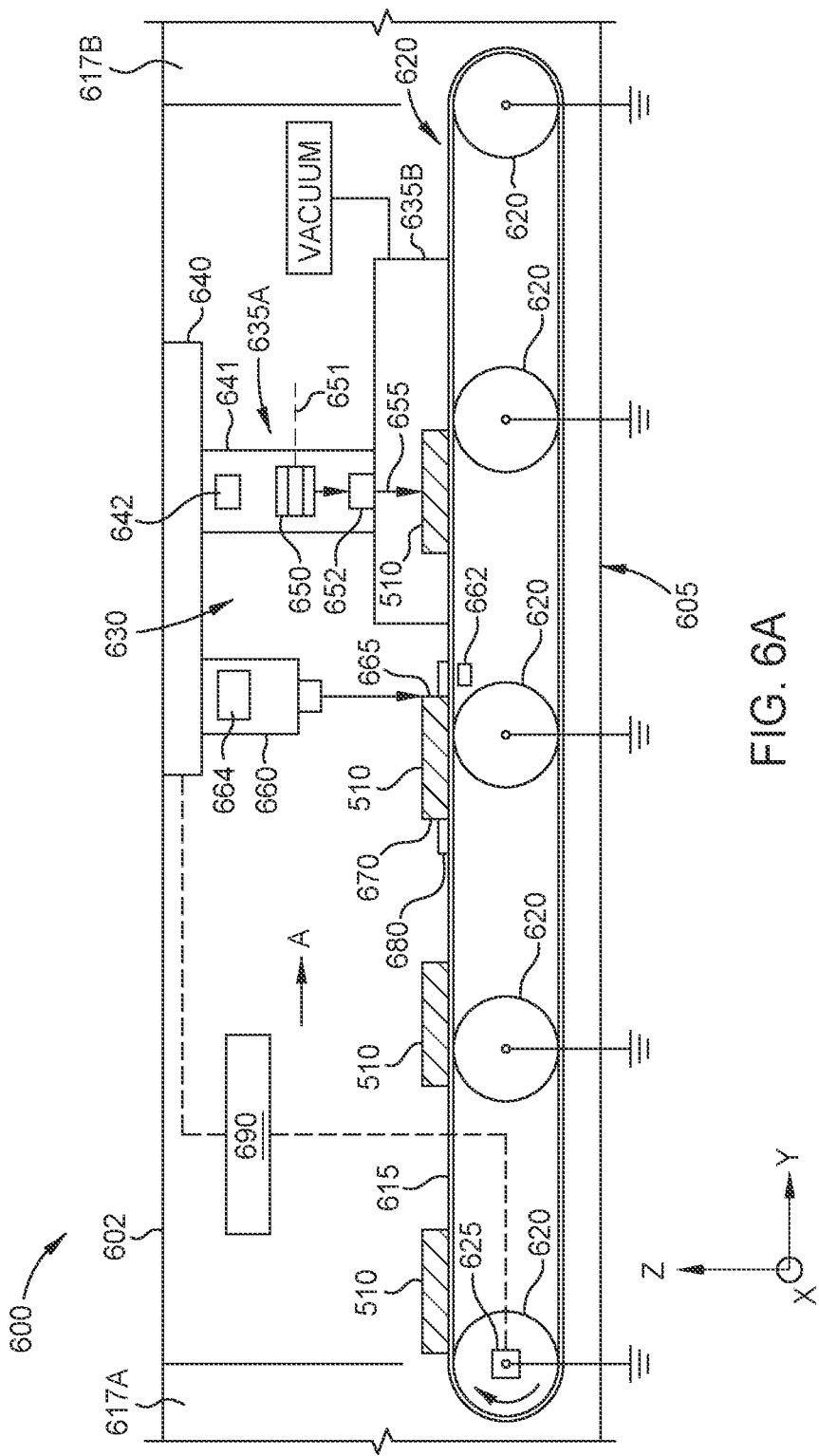
FIG. 6A is a schematic side view of an example laser drilling system according to at least one embodiment of the present disclosure.

Embodiments of the present disclosure also generally relate to apparatus for laser drilling blind vias. FIG. 6A is a schematic side view of an example laser drilling system 600 for carrying out certain aspects of the present disclosure according to some embodiments.

The laser drilling system 600 includes an enclosure 602 having a substrate positioning system 605 therein. The substrate positioning system 605 can be a conveyor for supporting and transporting substrates 510 through the laser drilling system 600. The laser drilling system 600 can be used to drill blind vias 501 (FIG. 5) in one or more layers disposed on a substrate 510 (or a plurality of substrates) in accordance with embodiments of the present disclosure. Each substrate 510 can be an example substrate illustrated in FIGS. 1 and 2. In at least one embodiment, the mask of the substrate 510 can face upward for processing in the laser drilling system 600.

In at least one embodiment, the substrate positioning system 605 is a linear conveyor system that includes a transport belt 615, which can be continuous, of a material configured to support and transport a line of the substrates 510 through the laser drilling system 600 in a flow path "A". The enclosure 602 is positioned between a loading station 617A for providing substrates 510 and an unloading station 617B for receiving processed substrates 510. The loading station 617A and the unloading station 617B can be coupled to the enclosure 602 and can include robotic equipment and/or transfer mechanisms that provide substrates 510 to the transport belt 615. The substrate positioning system 605 includes support rollers 620 that support and/or drive the transport belt 615. The support rollers 620 are driven by a mechanical drive 625, such as a motor/chain drive, and are configured to transport the transport belt 615 at a linear speed of from about 100 millimeters per second (mm/s) to about 2000 mm/s, such as from about 500 mm/s to about 2000 mm/s, or from about 500 mm/s to about 1500 mm/s during operation. The mechanical drive 625 can be an electric motor, such as an alternating current (AC) or direct current (DC) servo motor. The transport belt 615 can be made of, e.g., stainless steel, a polymeric material, and/or aluminum. In at least one embodiment, the transport belt 615 includes two parallel belts that can be spaced apart in the X-direction, wherein each of the two parallel belts have a width in the X-direction that is smaller than the X-direction dimension of the substrates 510. In this configuration, each substrate 510 in the laser drilling system 600 can be disposed on a portion of both parallel belts.

The substrate positioning system 605 can be a transfer device configured to sequentially transport a line of the substrates 510 (e.g., in the flow path "A") toward and through a laser scanning apparatus 630. The laser scanning apparatus 630 includes an optical device 635A coupled to a support member 640 that supports the optical device 635A above the transport belt 615 and substrates 510. The laser scanning apparatus 630 also includes a scanning chamber 635B that is fixed in position relative to the transport belt 615 adjacent the optical device 635A allowing the substrates 510 to pass therethrough on the transport belt 615.

Figure 5:
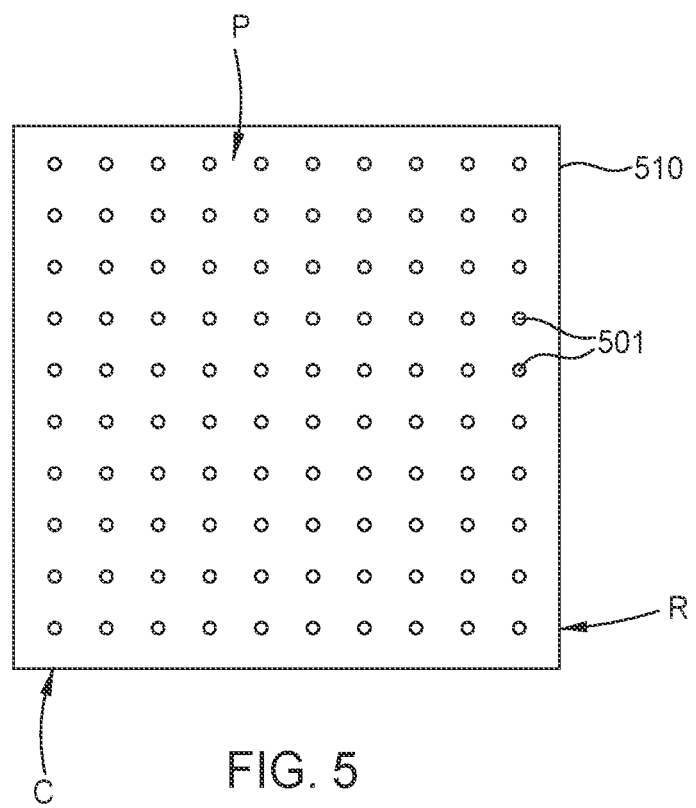
FIG. 5 is a schematic plan view of an example substrate having a plurality of blind vias formed by apparatus and methods disclosed herein according to at least one embodiment of the present disclosure.
Figure 6B:
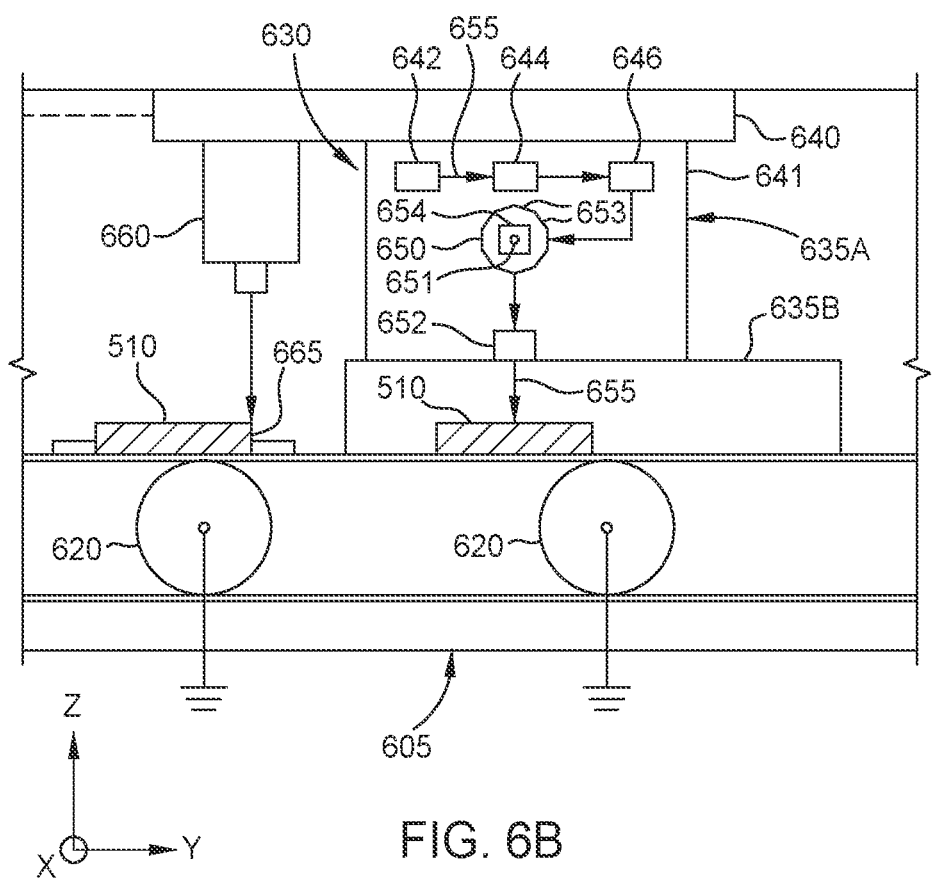
FIG. 6B is an enlarged side view of the example optical device of FIG. 6A according to at least one embodiment of the present disclosure.

FIG. 6B is a side view of the example optical device 635A of FIG. 6A, wherein the optical device 635A is rotated 90 degrees from its standard position shown in FIG. 6A for discussion purposes. FIG. 5 is a schematic plan view of a substrate 510 having a plurality of blind vias 501 formed by the optical device 635A of FIGS. 6A and 6B. The optical device 635A includes a housing 641 that provides light or electromagnetic radiation that is directed toward the surface of the substrates 510 as the substrates 510 pass through the scanning chamber 635B on the transport belt 615. In at least one embodiment, the optical device 635A, in combination with the movement of the transport belt 615, is configured to form a pattern (P), as shown in FIG. 5, which can include a pattern of rows (R) and columns (C) of blind vias 501 formed in a substrate 510. In some embodiments, the optical device 635A forms the pattern (P) on the substrate 510 in a time period of about 0.5 milliseconds (ms) or less, such as from about 0.01 ms to about 0.1 ms or from about 0.001 ms to about 0.005 ms using an optics system that can provide a pulsed beam that traverses the substrate 510 at a high speed as the substrate 510 is moved on the transport belt 615. The optical device 635A also includes a laser source 642, such as a femtosecond laser source, that emits light or electromagnetic radiation through an optics system that provides, e.g., about 50000 blind vias in the substrate 510 having desired characteristics described herein, such as diameter and taper angle.

In laser machining processes, unlike typical plasma process in semiconductor processing, the plasma is more like a cloud or plume that can cover the whole wafer surface, a laser beam, particularly when being focused, is only a tiny spot, therefore, typically a relative movement between laser beam and sample (e.g., wafer) is needed to process a whole sample. The relative movement can be realized in different ways. In a first way, and in some embodiments, the laser beam is kept stationary and the substrate is moved by a linear stage with motion in X/Y/Z(height)/Theta angle (on X-Y plane to rotate sample)/A tilting angle (on X-Z and Y-Z plane to tilt sample) directions. For micromachining, typically, X/Y/Z/theta movement can be enough. In a second way, and in some embodiments, the laser source and/or laser focusing head is mounted on a X/Y/Z/Theta stage.

In a third way and in some embodiments, the substrate is kept stationary on a chuck, and the laser beam is scanned across the substrate. Optical scanners are used to direct, position, and/or "scan" a laser beam over a desired area of a substrate. In this case, a light beam is refracted, diffracted, and/or reflected by optical scanners to realize its movement on a substrate surface. Generally, there are three types of optical scanners: acousto-optic scanners that deflect a beam using diffraction; electro-optic scanners that deflect a beam using refraction; and mechanical scanners (resonant, polygonal, and galvanometer scanning types) that deflect a beam using reflection.

A fourth way is hybrid movement of the laser beam and the sample. For example, the laser beam is scanned across a substrate while moving the substrate on the chuck/stage simultaneously or in sequence. Additionally, or alternatively, the scanner is mounted on a one-axis moving stage to move and scan beam.

In some embodiments, optical scanning technology such as mechanical scanners, such as polygon and/or galvos, are used to move the laser beam from one position to another position on the substrate surface in order to, e.g., drill via arrays at designated locations on the substrate. These mechanical scanners work by rotating a physical mirror that can be coated to reflect any wavelength or combination of wavelengths off the rotating mirror with very high reflectivity—and thus, high optical throughput. The achievable scan angle in optical degrees is double the actual motor rotation angle. Using that physical mirror, a polygonal scanner can be made to scan a beam over very wide angles, but having the limitation of scanning the same pattern over and over again. A polygon scanner performs one-axis scanning. To generate a 2-dimensional pattern, the other axis-movement can be provided by adding a linear stage or a galvo mirror.

Mechanical galvanometer-based scanners (or galvos), typically involve a physical mirror operated by a motor. Most often, the mirror is attached to the shaft of the motor, but in some designs the mirror and motor may be a single integral unit. Galvo motors can rotate over a range of angles (typically around ±20°). Galvo motors can also incorporate a high-precision position detector that provides feedback to a separate controller, delivering pointing repeatability of 5 μrad (5 mm at a distance of 1 km). Two galvanometer-scanners can be configured for two-axis scanning.

In at least one embodiment, the speed of the transport belt 615 is controlled at about 100 mm/s to about 5000 mm/s, such as about 250 mm/s to about 2000 mm/s, such as about 0.5 m/s to about 1 m/s, during operation, in order to form multiple blind vias 501 in a substantially linear row in the X-direction (FIG. 6A) on the substrates 510 as the substrates 510 pass below the optical device 635A on the transport belt 615 in the Y-direction.

In at least one embodiment, and as an alternative to (or in addition to transport belt 615), a galvoscanner is used to change drilling position from one via to the next.

Referring again to FIG. 6B, the laser source 642 can emit light or electromagnetic radiation 655 through a process of optical amplification based on stimulated emission of photons. In at least one embodiment, the laser beam emitted by the laser source 642 is a Gaussian beam. In some embodiments, the emitted electromagnetic radiation 655 has a high degree of spatial and/or temporal coherence. In at least one embodiment, the laser source 642 emits a continuous or pulsed wave of light or electromagnetic radiation 655 that is directed to the optics system, which includes a beam expander 644, a beam collimator 646, and a galvanometer scanner 650.

The galvanometer scanner 650 can include moveable mirrors to steer the laser beam, and the steering of the beam can be one-, two-, or three-dimensional. In order to position the laser beam in two dimensions, the galvanometer scanner 650 can rotate one mirror along two axes or can reflect the laser beam onto two closely spaced mirrors that are mounted on orthogonal axes. To position the focus of the laser beam in three dimensions, a servo-controlled galvanometer scanner can be used. Characteristics of the laser source 642, such as a femtosecond laser source, are described above.

In some embodiments, the pulse width and frequency of the pulses of electromagnetic radiation 655 are controlled by providing the laser source 642 with an external trigger signal that is provided at a desired frequency from a controller 690.

The pulses of electromagnetic radiation 655 emitted from the laser source 642 are received at the beam expander 644 having a first diameter, such as from about 1 mm to about 6 mm, such as from about 2 mm to about 5 mm, such as from about 3 mm to about 4 mm. The beam expander 644 can increase the diameter of the electromagnetic radiation 655 to a second diameter by a preset magnification, such as about 2× magnification, such as about 5× magnification, such as about 8× magnification, or the beam expander 644 can have an adjustable range of magnification, such as from about 1× to about 8×. The pulses of electromagnetic radiation 655 are then delivered to the beam collimator 646 for narrowing the beam.

In at least one embodiment, the beam collimation function is integrated into the beam expander 644. That is, in such embodiments, the beam expander 644 is also itself a beam collimator. Here, the beam expander 644 has at least two functions—expanding to beam size by certain magnification AND collimating the beam. The beam expander can have a fixed magnification (e.g., 2×, then the output beam diameter is equal to 2× input beam diameter) or an adjustable range of magnification (e.g., 3× to 8×). For example, a 2 mm diameter laser beam can enter the input side of a 3× beam expander, then at the output (exit) side of beam expander is a 6 mm diameter beam as output. This 6 mm beam (as it propagates along the optical axis) can be a divergent beam, or a convergent beam, but typically not, a well collimated beam. A perfectly collimated beam neither diverges nor converges as it propagates along the optical axis. Through the operation of "beam collimating" the beam can be adjusted to have very minor divergence or convergence so that over a few meters travel distance, the beam diameter may only change by about 1% to about 2%, or less.

From the beam collimator 646, the pulses of electromagnetic radiation 655 are delivered to the galvanometer scanner 650, which steers the pulses of electromagnetic radiation 655 through a focusing lens 652 and onto the substrate 510. The focusing lens 652 can be a telecentric focusing lens. The focusing lens 652 can have one or more lenses.

The galvanometer scanner 650 steers the pulses of electromagnetic radiation through the focusing lens 652, which is part of the optics system of the optical device 635A, and onto a surface of the substrate 510, which is continually moving in the Y-direction on the transport belt 615 in the scanning chamber 635B (FIG. 6A). Thus, the transport belt 615 does not need to stop/start during the blind via formation process on the substrate 510, which can increase throughput. However, in some embodiments, the surface of the substrate is periodically moving in the Y-direction on the transport belt 615 in the scanning chamber 635B (FIG. 6A). The galvanometer scanner 650 can include a mirror having multiple reflecting facets arranged such that each of the reflecting facets 653 can be generally angled relative to another one of the reflecting facets 653 in a direction relative to an axis of rotation 651 of the galvanometer scanner 650 (into the page in the X direction in FIG. 6B). The angle of each of the reflecting facets 653 of the galvanometer scanner 650 allows the electromagnetic radiation 655 to be scanned in one direction (X-direction in FIG. 6A) across the surface of the substrate 510 as the galvanometer scanner 650 is rotated about the axis of rotation 651 by an actuator 654. The actuator 654 can be used to control the speed of rotation of the galvanometer scanner 650 to a desired linear speed, such as a speed from about 0.5 m/sec to about 10 m/sec, such as from about 1 m/sec to about 6 m/sec, such as from about 2 m/sec to about 5 m/sec. The speed of scanning can be changed/fixed during the laser drilling process for creation of a pattern on the substrate 510. In at least one embodiment, the scanning speed is fixed such that all pulses are directed to one spot when drilling an individual via. This is often called percussion drilling or punch. From via to via, the galvo mirror can scan to change the drilling location.

For example, the rotational speed of the galvanometer scanner 650 can be set at a first speed for creation of a first pattern on one or more first substrates, and the first speed can be maintained during the ablation of each of the one or more first substrates. If a different pattern is desired on one or more second substrates, the rotational speed of the galvanometer scanner 650 can be set at a second speed that is different than the first speed, and the second speed can be maintained during the ablation of each of the one or more second substrates.

In some embodiments, the rotation of a single facet of the galvanometer scanner 650, as it is reflecting the delivered pulses of electromagnetic radiation 655 from the laser source 642, creates a full row (R) of blind vias 501 (e.g., a row in the X-direction) in one or more layers formed on the substrate 510. The electromagnetic radiation 655 is scanned across the surface of the substrate 510 by use of the galvanometer scanner 650, while the substrate 510 is transferred in an orthogonally-oriented Y-direction resulting in rows (R) of blind vias 501 (e.g., in the X-direction) spanning the length of the substrate 510 (e.g., in the Y-direction). In another example, the Y-direction is positioned at an angle to the X-direction. In yet another example, the Y-direction is positioned at an angle of about 90 degrees plus or minus a few degrees relative to the X-direction.

In at least one embodiment, the optics system of the optical device 635A are configured to deliver a focused beam diameter from about 1.5 μm to about 7 μm, such as from about 2 μm to about 6 μm, such as from about 3 μm to about 5 μm, for formation of the blind vias 501 with an entry diameter $D_1$ equal to about 5 μm; and to deliver a focused beam diameter from about 5 μm to about 14 μm, such as from about 7 μm to about 12 μm, such as from about 8 μm to about 10 μm, for formation of the blind vias 501 with an entry diameter $D_1$ equal to about 10 μm (e.g., $D_1$ as defined in FIG. 2B or FIG. 2C). In some embodiments, the number of pulse bursts to drill a hole can be from about 1 burst per via to about 40 bursts per via, such as from about 3 bursts per via to about 30 bursts per via, such as from about 5 bursts per via to about 20 bursts per via.

Referring again to FIG. 6A, the laser drilling system 600 also includes a substrate sensing system 660 including one or more substrate position sensors. The substrate sensing system 660 uses an optical sensor 662 to detect a leading edge 665 of the substrate 510 and sends corresponding signals to a controller 690. The controller 690, in turn, sends signals to the optical device 635A to time the operation of the laser source 642 and the rotation of the galvanometer scanner 650 to begin the laser scanning operation as the leading edge 665 of the substrate 510 is beneath the focusing lens 652. The controller 690 further controls the rotational speed of the galvanometer scanner 650 to scan a row (R) of blind vias 501 in one or more layers disposed on the substrate 210 as each facet of the galvanometer scanner 650 is rotated across the pulses of electromagnetic radiation 655. The controller 690 further controls the speed of the substrate positioning system 605 and the rotation of the galvanometer scanner 650, such that as a first row (R) of blind vias 501 (e.g., aligned in the X-direction) is finished, the next row (R) of blind vias 501 can begin at a desired spacing (e.g., in the direction A) from the first row due to the linear movement of the substrate 510 by the substrate positioning system 605. Accordingly, and in some embodiments, as the substrate 510 is moved beneath the optical device 635A, rows (R) of blind vias 501 can be formed in one or more layers of the substrate 510 across the entire width and length of the substrate 510. The controller 690 further controls the timing of the optical device 635A, such that as a trailing edge 670 of the substrate 510 passes beneath the focusing lens 652, the scanning operation ceases after a desired period of time has elapsed until the leading edge of the next substrate 510 is positioned beneath the focusing lens 652. The controller 690 can be any controller having a suitable processor, software, and memory for operation of the laser drilling system 600. The substrate sensing system 660 also includes a substrate alignment device 680 configured to align the substrates 510 prior to entry into the scanning chamber 635B.

The controller 690 generally includes a central processing unit (CPU) (not shown), memory (not shown), and support circuits (not shown). The CPU can be one of any form of computer processor used in industrial settings for controlling system hardware and processes. The memory can be connected to the CPU and can be one or more of a readily available memory, such as random access memory (RAM), read only memory (ROM), floppy disk, hard disk, or any other form of digital storage, local or remote. Software instructions and data can be coded and stored within the memory for instruction to the CPU. The support circuits can also be connected to the CPU for supporting the processor in a conventional manner. The support circuits can include cache, power supplies, clock circuits, input/output circuitry subsystems, and the like. A program (e.g., instructions) readable by the controller 690 can include code to perform tasks relating to monitoring, executing, and controlling the movement, support, and positioning of the substrates 510 along with various process recipe tasks to be performed in the laser drilling system 600. In at least one embodiment of the controller 690, the process of forming holes on a surface of a substrate includes at least one scan (to form a full row (R) of blind vias 501 (shown in FIG. 2C)) that can be interrupted at desirable times to further control formation of blind vias 501 in a desirable location on the surface of the substrate. This capability can enable brief and/or selective stopping/starting the train of pulses, and enable advanced patterning features.

The controller 690 further controls a height sensor 664. Although FIG. 6A shows the height sensor 664 as being part of the substrate sensing system 660, the height sensor 664 can be a separate unit. During use of the laser drilling system 600, the height sensor 664 adjusts the optical device 635A about the Z-direction before, during, or after ablation as described in FIG. 8 and FIG. 9. In at least one embodiment, the height sensor 664 precisely determines the surface of the mask disposed on the one or more layers of the substrate 510.

Figure 7:
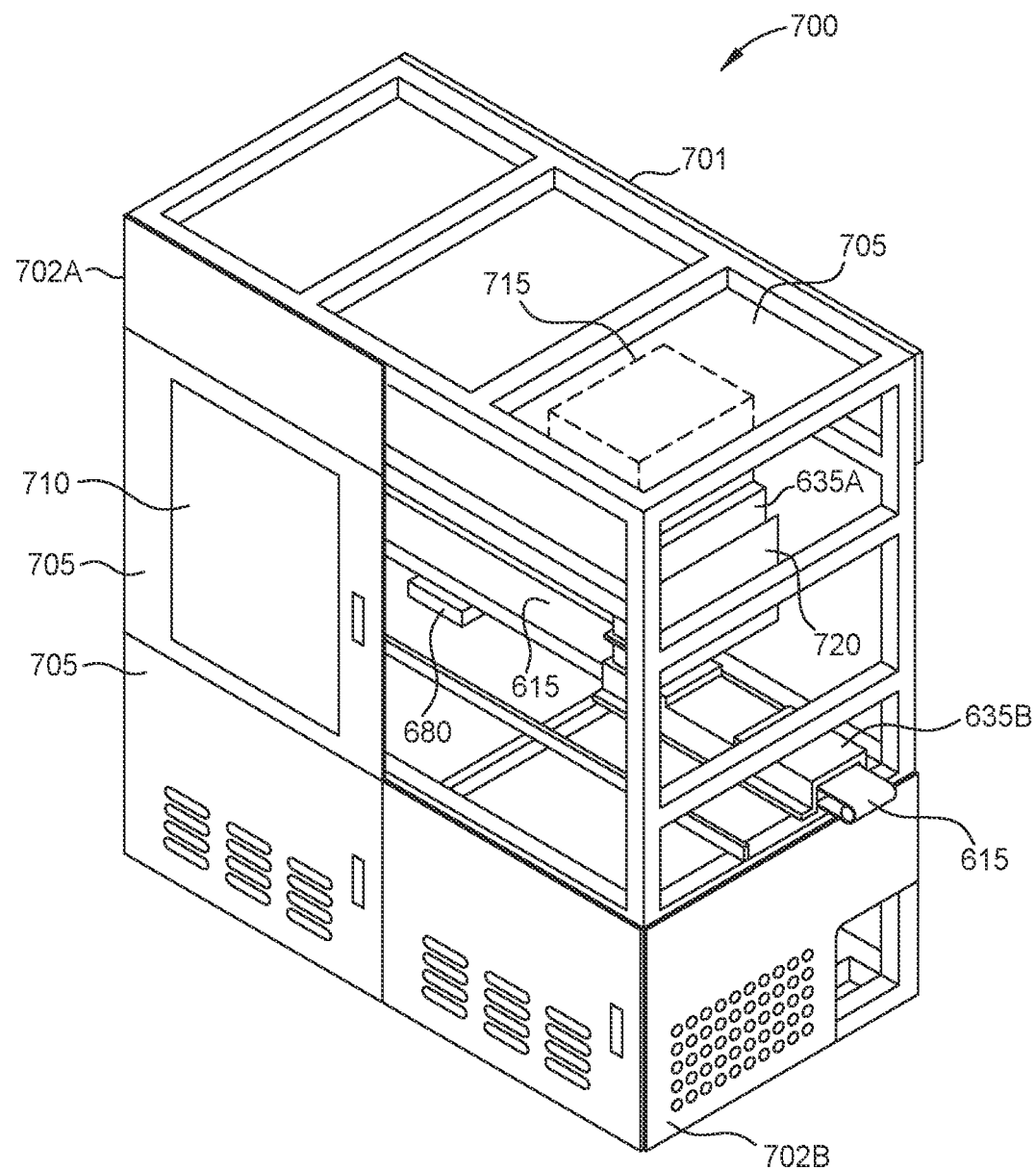
FIG. 7 is an isometric view of an example laser drilling tool having the example laser drilling system of FIG. 6A disposed therein according to at least one embodiment of the present disclosure.

FIG. 7 is an isometric view of an example laser drilling tool 700 having the optical device 635A and the scanning chamber 635B disposed therein. The laser drilling tool 700 includes a main frame 701 having a first side 702A that can be coupled to a loading station 617A (shown in FIG. 6A) and a second side 702B that can be coupled to an unloading station 617B (shown in FIG. 6A). The main frame 701 can include panels 705 that can function as doors or removable sheets, and a portion of the panels 705 are not shown to illustrate components within the laser drilling tool 700. The panels 705 include a view window 710 to provide visual access to the interior of the laser drilling tool 700. The view window 710 can include laser safety glass and/or filters that enable viewing of the electromagnetic radiation during a laser drilling process within the laser drilling tool 700 without the need for safety glasses. Power sources and control equipment, such as a laser power supply 715 (shown in dashed lines) is housed within the main frame 701. Additionally, an optical alignment device 720 (FIGS. 7 and 8) is coupled to the main frame 701 within the laser drilling tool 700. The optical alignment device 720 can adjust the position of the optical device 635A relative to the motion direction of the substrates 510 on the substrate positioning system 605, thereby adjusting the beam path emitted relative to a substrate.

Figure 8:
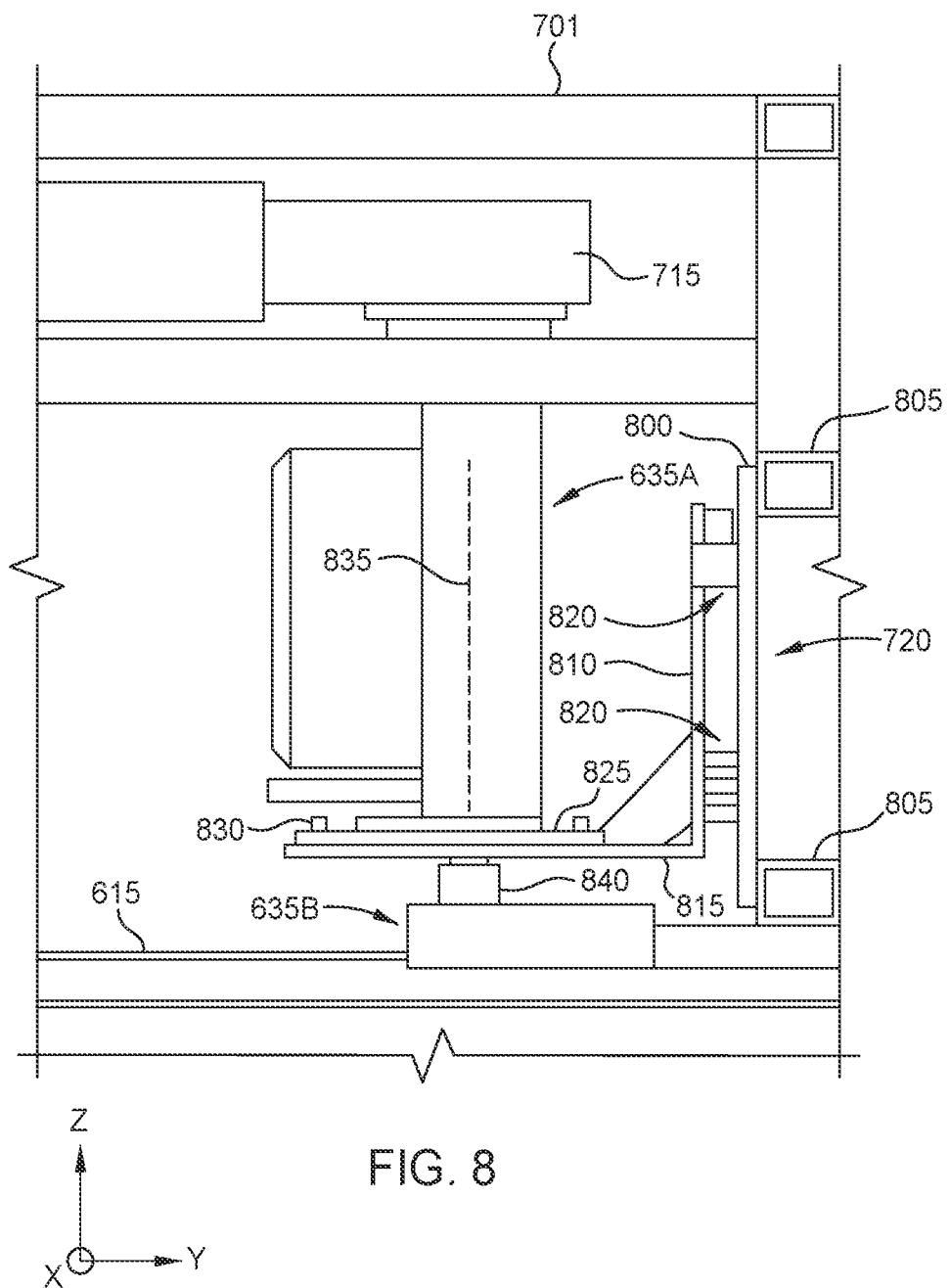
FIG. 8 is a side view of an example embodiment of the optical alignment device of FIG. 7 according to at least one embodiment of the present disclosure.
Figure 9:
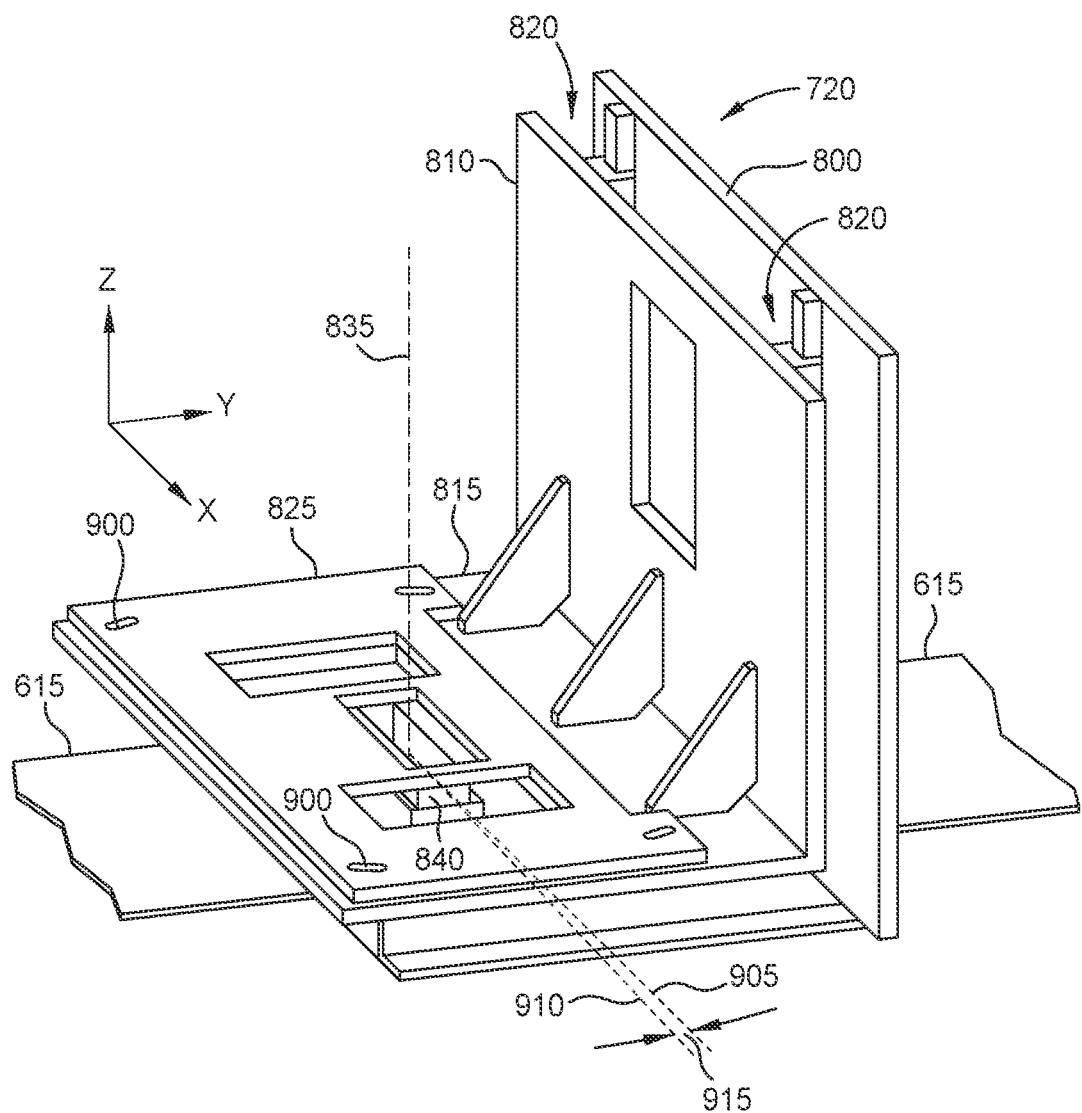
FIG. 9 is an isometric view of the example optical alignment device of FIG. 8 according to at least one embodiment of the present disclosure.

As discussed above, the optical device 635A can be adjusted about the Z-direction before, during, or after ablation using a height sensor 664 as described in FIG. 8 and FIG. 9.

FIG. 8 is a side view of an example embodiment of the optical alignment device 720. The optical alignment device can be coupled to a height sensor 664 (not shown). The optical alignment device 720 includes a base plate 800 that is coupled to one or more support members 805 of the main frame 701. The base plate 800 is movably coupled to a first support plate 810 having a second support plate 815 extending therefrom in a plane substantially orthogonal to the plane of the first support plate 810. The second support plate 815 generally supports the optical device 635A. The first support plate 810 is coupled to the base plate 800 by a plurality of adjustment devices 820, which can include fasteners, linear guides, or a combination thereof. The adjustment devices 820 can enable at least height adjustment (in the Z-direction) of the optical device 635A and can enable a theta adjustment in the X-Z plane and/or the Y-Z plane. The height adjustment can be used to adjust the focal length of the focusing lens 652 (FIGS. 6A and 6B) of the optical device 635A. The adjustment devices 820 can also be used to level the second support plate 815 relative to a plane of the transport belt 615. An adjustable aperture device 840 is provided between the second support plate 815 and the scanning chamber 635B. The adjustable aperture device 840 can be, e.g., a telescoping housing having an aperture formed therein that is sized to receive a beam path provided by the optical device 635A. The telescoping housing can be adjusted upward or downward based on a height adjustment of the optical alignment device 720.

In some embodiments, the optical alignment device 720 also includes an adjustable mount plate 825 disposed between the second support plate 815 and a lower surface of the optical device 635A. The adjustable mount plate 825 is secured to the lower surface of the optical device 635A and is fastened to the second support plate 815 by fasteners 830. The adjustable mount plate 825 can be adjusted for different angular orientations as well as leveling the optical device 635A to tune a scan plane 835 of a beam path emitted by the optical device 635A during processing. As described in more detail in FIG. 9, the adjustable mount plate 825 can be rotated about the scan-plane axis, e.g., the Z-direction, to adjust the orientation of the scan plane 835 (e.g., plane aligned to the row (R) direction on the substrate in FIG. 5) of the output of the optical device 635A. Adjustment of the adjustable mount plate 825 can be performed to alter the beam path(s) within the scan plane of the optical device 635A to align a row (R) of blind vias 501 on a substrate 510 (FIG. 5).

FIG. 9 is an isometric view of the example optical alignment device 720 of FIG. 8. Although the optical device 635A is not shown in this view, the scan plane 835 of the optical device 635A is shown. The adjustable mount plate 825 includes a plurality of slots 900 that receive the fasteners 830 shown in FIG. 8. Each of the slots 900 can permit the adjustable mount plate 825 to rotate relative to the Z axis in order to adjust the scan plane of the optical device 635A. For example, a first alignment position 905 of the adjustable mount plate 825 can include a direction wherein the scan plane is substantially parallel to the leading edge 665 of the substrate 510 (shown in FIG. 2A). In at least one embodiment, the adjustable mount plate 825 is adjusted to a second alignment position 910, which corresponds to an angle 915. The angle 915 can be adjusted based on, e.g., the speed of the substrate(s) 510 on the transport belt 615 and/or the scan speed of the electromagnetic radiation 655. The scan speed of the electromagnetic radiation 655 can be at least partially based on pulse width of the electromagnetic radiation 655 and/or movement of the galvanometer scanner 650 (shown in FIG. 6B).

In at least one embodiment, the angle 915 is from about −20° degrees to about +20° degrees from the normal axis of the mirror surface, when the speed of the transport belt 615 is about 140 mm/s to about 180 mm/s, with a pulse width of about 1 fs to about 1.5 ms, and the scan speed of the galvanometer scanner 650 is about 1,000 RPM, which results in rows (R) of blind vias 501 that are substantially linear and/or parallel with the leading edge 665 of the substrate 510.

Any of the operations described above can be included as instructions in a computer-readable medium for execution by a control unit (e.g., controller 690) or any other processing system. The computer-readable medium can comprise any suitable memory for storing instructions, such as read-only memory (ROM), random access memory (RAM), flash memory, an electrically erasable programmable ROM (EEPROM), a compact disc ROM (CD-ROM), a floppy disk, and the like.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

For the purposes of this present disclosure, and unless otherwise specified, all numerical values within the detailed description and the claims herein are modified by "about" or "approximately" the indicated value, and consider experimental error and variations that would be expected by a person having ordinary skill in the art.

All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa.

What is claimed is:

1. A method of forming a blind via in a substrate, comprising:
   conveying the substrate to a scanning chamber of a laser drilling system having a galvanometer scanner, a beam expander, and a collimator coupled to a femtosecond laser source configured to emit a Gaussian laser beam, the substrate comprising:
   a conductive layer,
   a dielectric layer disposed on at least a portion of the conductive layer, and
   a mask layer disposed on at least a portion of the dielectric layer;
   detecting a height of the mask layer by a height sensor of the laser drilling system, the mask layer providing a substrate surface;
   determining one or more properties of the blind via, the one or more properties of the blind via comprising:
   a top diameter of the blind via and a bottom diameter of the blind via, the blind via having a height from the top diameter to the bottom diameter, the top diameter being greater than the bottom diameter;
   a volume of the blind via, the volume corresponding to the top diameter, the bottom diameter, and the height of the blind via; or
   a taper angle of about 80 degrees or more;
   removing at least a portion of the mask layer by focusing a Gaussian laser beam emitted from the femtosecond laser source of the laser drilling system, under laser process parameters, at the substrate surface;
   after removing the at least a portion of the mask layer, adjusting the laser process parameters based on signals from the height sensor regarding the height of the mask layer and the one or more determined properties;
   removing at least a portion of the dielectric layer within the volume by focusing the Gaussian laser beam using the beam expander, the collimator, and the galvanometer scanner, under the adjusted laser process parameters, to form the blind via; and
   removing the mask layer from the substrate.

2. The method of claim 1, wherein the laser process parameters comprise a laser power, a laser energy in a burst, a focal beam diameter, a focus height, a burst energy, a pulse energy, a number of pulses in a burst, a pulse frequency, a burst frequency, a beam spot size, an $M^2$ value, an offset of beam focusing from substrate surface, or combinations thereof.

3. The method of claim 1, wherein the laser process parameters comprise:
an amount of laser energy in a burst of about 5 µJ or more;
a focal beam diameter that is from about 2 µm to about 10 µm for drilling 5 µm diameter vias;
a focal beam diameter that is from about 7 µm to about 12 µm for drilling 10 µm diameter vias;
a focus height that is from about 0 µm to about 50 µm;
a pulse frequency that is about 500 MHz or more;
a number of pulses in a burst that is about 2 or more;
a number of bursts of about 2 or more;
a burst frequency of about 100 kHz or more; or
combinations thereof.

4. The method of claim 1, wherein the top diameter is about 10 µm or less.

5. The method of claim 1, wherein:
the mask layer comprises Al, Cu, W, Mo, Cr, or combinations thereof; and
the mask layer has a height of about 2 µm or less.

6. The method of claim 5, wherein when the mask layer comprises Mo or W, the method further comprises depositing a layer of copper on the mask layer.

7. The method of claim 1, wherein the femtosecond laser source is a femtosecond ultraviolet laser with a wavelength of about 400 nm or shorter.

8. The method of claim 5, wherein the mask layer comprises Cr.

9. A method of forming a blind via in a substrate, comprising:
conveying the substrate to a scanning chamber of a laser drilling system having a galvanometer scanner, a beam expander, and a collimator coupled to a femtosecond laser source configured to emit a Gaussian laser beam, the substrate comprising:
a conductive layer of about 2 µm or more in height,
a dielectric layer disposed on at least a portion of the conductive layer, and
a pre-etched mask layer disposed on at least a portion of the dielectric layer, the pre-etched mask layer having blind via openings to expose at least a portion of the dielectric layer, the at least a portion of the dielectric layer providing a substrate surface;
detecting the blind via openings of the pre-etched mask layer by a height sensor of the laser drilling system, the height sensor configured to determine a height of the pre-etched mask layer;
determining one or more properties of the blind via, the one or more properties of the blind via comprising:
a top diameter of the blind via and a bottom diameter of the blind via, the blind via having a height from the top diameter to the bottom diameter, the top diameter being greater than the bottom diameter, and the top diameter corresponding to the blind via openings;
a volume of the blind via, the volume corresponding to the top diameter, the bottom diameter, and the height of the blind via; or
a taper angle of 80 degrees or more;
removing a first portion of the dielectric layer within the volume of the blind via, without causing more than half of the thickness of mask layer damage to the pre-etched mask layer, by focusing a Gaussian laser beam emitted from the femtosecond laser source of the laser drilling system, under laser process parameters, at the substrate surface;
after removing the first portion of the dielectric layer, adjusting the laser process parameters based on signals from the height sensor and the one or more properties;
removing a second portion of the dielectric layer within the volume by focusing the Gaussian laser beam using the galvanometer scanner, the beam expander, and the collimator, under the adjusted laser process parameters, to form the blind via; and
removing the pre-etched mask layer from the substrate.

10. The method of claim 9, wherein the laser process parameters comprise a laser power, a laser energy in a burst, a focal beam diameter, a focus height, a burst energy, a pulse energy, a number of pulses in a burst, a pulse frequency, a burst frequency, a beam spot size, an $M^2$ value, an offset of beam focusing from substrate surface, or combinations thereof.

11. The method of claim 9, wherein the laser process parameters comprise:
an amount of laser energy in a burst of about 5 µJ or more;
a focal beam diameter that is from about 2 µm to about 10 µm for drilling 5 µm diameter vias;
a focal beam diameter that is from about 7 µm to about 12 µm for drilling 10 µm diameter vias;
a focus height that is from about 0 µm to about 50 µm;
a pulse frequency that is about 500 MHz or more;
a number of pulses in a burst that is about 2 or more;
a number of bursts of about 2 or more;
a burst frequency of about 100 KHz or more; or
combinations thereof.

12. The method of claim 9, wherein the top diameter is about 10 µm or less.

13. The method of claim 9, wherein:
the pre-etched mask layer comprises Al, Cu, W, Mo, Cr, or combinations thereof; and
the pre-etched mask layer has a height of 3 µm or less.

14. The method of claim 9, wherein when the pre-etched mask layer comprises Mo or W, the method further comprises depositing a layer of copper on the pre-etched mask layer.

15. The method of claim 13, wherein the mask layer comprises Cr.

16. A method of forming a blind via in a substrate, comprising:
conveying the substrate to a scanning chamber of a laser drilling system having a galvanometer scanner, a beam expander, and a collimator coupled to a femtosecond laser source configured to emit a Gaussian laser beam, the substrate comprising:
a conductive layer,
a dielectric layer disposed on at least a portion of the conductive layer, and
a mask layer disposed on at least a portion of the dielectric layer, the mask layer comprising Al, Cu, W, Mo, Cr, or combinations thereof, and the mask layer having a height of about 2 µm or less;
detecting a height of the mask layer by a height sensor of the laser drilling system, the mask layer providing a substrate surface;
determining one or more properties of the blind via, the one or more properties of the blind via comprising:
a top diameter of the blind via and a bottom diameter of the blind via, the blind via having a height from the top diameter to the bottom diameter, the top diameter being greater than the bottom diameter;

a volume of the blind via, the volume corresponding to the top diameter, the bottom diameter, and the height of the blind via; or a taper angle of about 80 degrees or more;

removing at least a portion of the mask layer by focusing a Gaussian laser beam emitted from the femtosecond laser source of the laser drilling system, under laser process parameters, at the substrate surface;

after removing the at least a portion of the mask layer, adjusting the laser process parameters based on signals from the height sensor regarding the height of the mask layer and the one or more determined properties; and removing at least a portion of the dielectric layer within the volume by focusing the Gaussian laser beam using the beam expander, the collimator, and the galvanometer scanner, under the adjusted laser process parameters, to form the blind via.

17. A method of forming a blind via in a substrate, comprising:

conveying the substrate to a scanning chamber of a laser drilling system having a galvanometer scanner, a beam expander, and a collimator coupled to a femtosecond laser source configured to emit a Gaussian laser beam, the substrate comprising:

a conductive layer of about 2 μm or more in height, a dielectric layer disposed on at least a portion of the conductive layer, and a pre-etched mask layer disposed on at least a portion of the dielectric layer, the pre-etched mask layer comprises Al, Cu, W, Mo, Cr, or combinations thereof;

and the pre-etched mask layer has a height of 3 μm or less, the pre-etched mask layer having blind via openings to expose at least a portion of the dielectric layer, the at least a portion of the dielectric layer providing a substrate surface;

detecting the blind via openings of the pre-etched mask layer by a height sensor of the laser drilling system, the height sensor configured to determine a height of the pre-etched mask layer;

determining one or more properties of the blind via, the one or more properties of the blind via comprising:

a top diameter of the blind via and a bottom diameter of the blind via, the blind via having a height from the top diameter to the bottom diameter, the top diameter being greater than the bottom diameter, and the top diameter corresponding to the blind via openings;

a volume of the blind via, the volume corresponding to the top diameter, the bottom diameter, and the height of the blind via; or a taper angle of 80 degrees or more;

removing a first portion of the dielectric layer within the volume of the blind via, without causing more than half of the thickness of mask layer damage to the pre-etched mask layer, by focusing a Gaussian laser beam emitted from the femtosecond laser source of the laser drilling system, under laser process parameters, at the substrate surface;

after removing the first portion of the dielectric layer, adjusting the laser process parameters based on signals from the height sensor and the one or more properties; and removing a second portion of the dielectric layer within the volume by focusing the Gaussian laser beam using the galvanometer scanner, the beam expander, and the collimator, under the adjusted laser process parameters, to form the blind via.

\* \* \* \* \*

UNITED STATES PATENT AND TRADEMARK OFFICE
CERTIFICATE OF CORRECTION

| | | |
|---|---|---|
| PATENT NO. | : 12,358,073 B2 | Page 1 of 1 |
| APPLICATION NO. | : 17/508512 | |
| DATED | : July 15, 2025 | |
| INVENTOR(S) | : Wei-Sheng Lei et al. | |

It is certified that error appears in the above-identified patent and that said Letters Patent is hereby corrected as shown below:

On the Title Page

On page 3, in Column 1, item (56) in "U.S. Patent Documents", Line 53, delete "Jafezi et al." and insert -- Hafezi et al. --.

In the Specification

In Column 11, Line 52, delete "always 1.0)," and insert -- always $\geq$ 1.0), --.

In the Claims

In Column 22, Line 31, in Claim 11, delete "KHz" and insert -- kHz --.

Signed and Sealed this
Twentieth Day of January, 2026

John A. Squires
*Director of the United States Patent and Trademark Office*